(12) United States Patent  
Yanagawa et al.

(10) Patent No.: US 7,705,536 B2  
(45) Date of Patent: Apr. 27, 2010

(54) DISPLAY DEVICE

(75) Inventors: Hiroto Yanagawa, Osaka (JP); Tetsuo Kawakita, Kyoto (JP); Taketoshi Nakao, Kyoto (JP); Hiroaki Takezawa, Nara (JP); Kiyohide Amemiya, Kanagawa (JP)

(73) Assignee: Panasonic Corporation, Osaka (JP)

( * ) Notice: Subject to any disclaimer, the term of this patent is extended or adjusted under 35 U.S.C. 154(b) by 694 days.

(21) Appl. No.: 10/594,155

(22) PCT Filed: Jan. 25, 2006

(86) PCT No.: PCT/JP2006/301113

§ 371 (c)(1),  
(2), (4) Date: Sep. 25, 2006

(87) PCT Pub. No.: WO2006/080335

PCT Pub. Date: Aug. 3, 2006

(65) Prior Publication Data

US 2007/0216273 A1  Sep. 20, 2007

(30) Foreign Application Priority Data

Jan. 25, 2005 (JP) .............................. 2005-017423  
Mar. 24, 2005 (JP) .............................. 2005-085440

(51) Int. Cl.  
*H01J 17/49* (2006.01)

(52) U.S. Cl. ........................................................ 313/582

(58) Field of Classification Search ................. 313/582, 313/584, 17, 24, 25  
See application file for complete search history.

(56) References Cited

FOREIGN PATENT DOCUMENTS

| JP | 11-251777 A | 9/1999 |
|---|---|---|
| JP | 2000-338904 A | 12/2000 |
| JP | 2000-347578 A | 12/2000 |
| JP | 2001-22280 A | 1/2001 |
| JP | 2001-67001 A | 3/2001 |
| JP | 2001-242792 A | 9/2001 |
| JP | 2001-266760 A | 9/2001 |
| JP | 2002-6755 A | 1/2002 |

OTHER PUBLICATIONS

"Flat-Panel Display," with Brief Summary, 1999, Japan.  
"Flat-Panel Display," 1999, Part 4, pp. 146-166.

*Primary Examiner*—Vip Patel  
(74) *Attorney, Agent, or Firm*—McDermott Will & Emery LLP

(57) ABSTRACT

A display device is provided which is capable of inhibiting a localized elevation in the temperature of a casing thereby uniformalizing the surface temperature distribution over the casing. A display device includes: a display panel having surface arrays of plural pixels for displaying an image by light radiation control on a pixel to pixel basis; an electronic component forming a control circuit configured to perform the light radiation control; a casing housing the display panel and the electronic component therein; and a flat heat-conductive sheet interposed between the display panel and the casing and between the electronic component and the casing.

24 Claims, 21 Drawing Sheets 20a, 20b

DISPLAY DEVICE

RELATED APPLICATIONS

This application is the U.S. National Phase under 35 U.S.C. §371 of International Application No. PCT/JP2006/301113, filed on Jan. 25, 2006, which in turn claims the benefit of Japanese Application No. 2005-017423 filed on Jan. 25, 2005, and Japanese Application No. 2005-085440 filed on Mar. 24, 2005 the disclosures of which Applications are incorporated by reference herein.

TECHNICAL FIELD

The present invention relates to flat-type display devices such as plasma display devices.

BACKGROUND ART

Plasma display panels (hereinafter will be referred to as PDPs) have become widespread as display devices of which representatives are thin-screen televisions. PDPs are display devices capable of thin and large screen display. The volume of production of PDPs is increasing by leaps and bounds year by year like liquid crystal display panels. A large number of technical literature documents have already been published concerning the display technology for plasma display devices using such PDPs (see non-patent document 1 for example).

Since such a plasma display device utilizes plasma discharge to display an image, the temperature of the PDP thereof is likely to become high. In addition, the control circuit for controlling the image display operation of the PDP includes a number of electronic components that generate heat. Accordingly, the temperature within the casing of such a plasma display device is likely to be elevated. For this reason, the plasma display device is provided with appropriate heat dissipation measures.

For example, FIG. 11 shows one exemplary construction of a conventional plasma display device using a PDP as a display device. Specifically, FIG. 11(a) is a rear view showing the plasma display device (in a condition without a back cover 18 to be described later) as viewed from behind and FIG. 11(b) is a sectional view, taken along line VB-VB of FIG. 11(a), of the plasma display device.

As shown in FIG. 11, a rectangular PDP 111 has a rear joined and fixed to a rectangular chassis 12 (i.e., a back member) having a slightly larger area than the PDP 11. The chassis 12 in a condition fixed to the PDP 111 is secured to a leg portion 13 serving as a pedestal of the plasma display device 150.

A front cover 15, which is positioned on the front of the PDP 11, has an opening matching a display surface of the PDP 11. A protective panel 14 is mounted on the front cover 15 so as to fit the opening.

On the rear of the chassis 12, a circuit board 17 carrying various electronic components 16 (including a driver LSI for example) mounted thereon for driving the PDP 11 is fixed to the chassis 12 as spaced a fixed clearance from the rear surface of the chassis 12 by means of a spacer S.

A back cover 18 is mounted on the leg portion 13 so as to embrace the PDP 11, the chassis 12, the electronic components 16 and the circuit board 17 from behind. The front cover 15 is fitted on a front portion of this back cover 10.

The back cover 18 is provided at suitable portions thereof with plural air intake holes 19a, 19b and 19c for allowing air to flow into the plasma display device 150 therethrough and plural air exhaust holes 19d and 19e for exhausting air exteriorly of the plasma display device 150.

As compared with other displays such as a liquid crystal display panel and a cathode-ray tube, the PDP 11 is likely to be heated to elevated temperatures due to image display relying upon discharge light emission. Since the PDP 11 uses a higher driving voltage than other displays (driving voltage: 200 to 300 V), the electronic components 16 (including the driver LSI for example) mounted on the circuit board 17 are also likely to be heated to elevated temperatures. Further, there is a tendency to raise the driving voltage for the driver LSI in order to raise the luminous efficiency of the PDP 11. This tendency makes the thermal problem of the plasma display device 160 more noticeable.

As shown in FIG. 11, a plurality of rod-shaped heat transfer members 20a and 20b are provided in order to allow heat generated from the PDP 11 and the electronic components 16 to dissipate to the back cover 18 efficiently. Each of the heat transfer members 20a and 20b has one end brought into contact with at least one of the PDP 11 via the chassis 12 and the circuit board 17 (into contact with the PDP 11 in FIG. 11) and an opposite end brought into contact with the back cover 18.

Thus, the rod-shaped heat transfer members 20a and 20b are positioned to allow heat transfer to occur between the back cover 18 and at least one of the PDP 11 and the circuit board 17.

Such rod-shaped heat transfer members 20a and 20b are evenly distributed in the lower and upper halves of the back cover 18 as shown in the plan view at FIG. 11(a). When the back cover 18 is equally divided into the upper half and the lower half, three rod-shaped heat transfer members 20a interconnecting the back cover 18 and the PDP 11 are arranged side by side horizontally of the plasma display device 150 in the upper half of the back cover 18. Similarly, three rod-shaped heat transfer members 20b interconnecting the back cover 18 and the PDP 11 are arranged side by side horizontally of the plasma display device 150 in the lower half of the back cover 18.

A structure achieving an effect similar to the heat dissipation effect of such rod-shaped heat transfer members 20a and 20b has already been published (see patent document 1). According to the design for heat dissipation described in this patent document 1, an electronic component that is likely to be heated to elevated temperatures and a rear portion of a casing are interconnected by a heat transfer member, so that heat generated from the electronic component is allowed to be transferred to the rear portion of the casing through the heat transfer member and then dissipated externally. Therefore, such a structure is capable of inhibiting an elevation in the temperature within the casing.

In attempt to minimize the elevation in the temperature within the casing of the plasma display device due to long-time display operation of the PDP, various heat dissipation techniques for the plasma display device have been developed hitherto.

For example, a plasma display device, which is intended to efficiently suppress localized heat generation by the PDP, has been disclosed, wherein: a heat-conductive sheet comprising silicone rubber or the like is interposed between the PDP and a heat-conductive plate of aluminum in order to improve the heat transfer coefficient between the PDP and the heat-conductive plate thereby enhancing the thermal intimacy therebetween; and plural heat pipes, radiator fins and a heat dissipation fan are disposed above the heat-conductive plate (see patent document 2).

Also, a cooling structure for plasma displays has been disclosed wherein a radiator joined to a PDP-supporting chassis and to an electronic component is joined to a rear cover having a high thermal conductivity which comprises an aluminum plate for example, thereby making it possible to dissipate heat generated from the PDP and the electronic component to the rear cover efficiently (see patent document 3).

Further, a PDP rear frame which has its weight kept light and is excellent in strength and heat dissipation property has been obtained by forming a linear ridge-groove structure on an internal surface of a PDP rear frame having an excellent thermal conductivity (comprising an aluminum plate for example) (see Patent document 4).

Non-patent document 1: FLAT PANEL DISPLAY 1999 (NIKKEI MICRODEVICES)

Patent document 1: Japanese Patent Laid-Open Publication No. 2000-338904

Patent document 2: Japanese Patent Laid-Open Publication No. HEI 11-251777

Patent document 3: Japanese Patent Laid-Open Publication No. 2000-347578

Patent document 4: Japanese Patent Laid-Open Publication No. 2001-242792

DISCLOSURE OF INVENTION

Problem to be Solved by Invention

The aforementioned conventional techniques, however, have a drawback that a portion of the casing to which the heat transfer member transfers heat is locally heated to elevated temperatures, though an elevation in the temperature within the casing of the display device can be suppressed to a certain degree.

A specific example of such a localized elevation in the temperature of the casing will be described with reference to FIG. 11.

The conventional heat dissipation design technique using the rod-shaped heat transfer members $20a$ and $20b$ to dissipate heat from the PDP 11 in the plasma display device shown in FIG. 11 aims principally at bringing a heat transfer medium into contact with a heat-generating member, namely, the PDP or electronic components mounted on the circuit board (hereinafter will be referred to as the PDP or the like) to allow heat generated from the PDP or the like to be dissipated to the outside of the device efficiently.

The technical design to dissipate heat generated from the PDP or the like to the outside through the casing 120 quickly is indispensable for making the plasma display device thinner and fan exclusion. For example, the essential design for efficient heat dissipation includes increasing the total cross-sectional area of the rod-shaped heat transfer members $20a$ and $20b$ by increasing the number of rod-shaped heat transfer members $20a$ and $20b$ shown in FIG. 11 as many as possible, and increasing the contact area between the rod-shaped heat transfer members $20a$ and $20b$ and the back cover 18 and between the rod-shaped heat transfer members $20a$ and $20b$ and the PDP 11 as large as possible.

Along with such an efficient heat dissipation design, uniformalizing the temperature distribution within the plasma display device (in terms of the surface temperature of the casing 120 of the plasma display device) is not a negligible factor in the heat dissipation design for the plasma display device. Nevertheless, the inventors of the present invention consider that the heat dissipation design of the plasma display device 150 shown in FIG. 11 does not take this factor into consideration.

For example, though heat generated from the PDP or the like is quickly dissipated toward the casing 120 through the rod-shaped heat transfer members $20a$ and $20b$ having an excellent thermal conductivity, the temperature of portions of the casing 120 located adjacent the rod-shaped heat transfer members $20a$ and $20b$ is elevated locally as a automatic operation resulting from concentration of heat generated from the PDP or the like on the rod-shaped heat transfer members $20a$ and $20b$.

Air taken into the plasma display device 150 shown in FIG. 11 through air intake holes $19a$, $19b$ and $19c$ located at the lower end portion of the back cover 18 is warmed within the device and then exhausted to the outside of the plasma display device 150 through air exhaust holes $19d$ and $19e$ along a path depicted by dotted line in FIG. 11($b$) according to the principle of ascending force of air. Thus, the temperature of an upper portion (the upper half shown in FIG. 11) of the plasma display device 150 tends to become higher than that of a lower portion (the lower half shown in FIG. 11) of the plasma display device 150. Accordingly, the surface (outer surface) temperature of the back cover 18 in the upper half of the plasma display device is easy to rise. Thus, the upper half of the back cover 18, which is likely to be touched by the consumer, is heated locally.

Such a localized elevation in the temperature of the casing 120 may pose thermally-induced uncomfortable feeling or the like for the consumer. This may result in the consumer demotivated to purchase the plasma display device.

The present invention has been made in view of the foregoing circumstances. Accordingly, it is an object of the present invention to provide a display device which is capable of preventing the occurrence of a localized elevation in the temperature of the casing thereby to uniformalize the surface temperature distribution over the casing.

Means for Solving Problem

In order to accomplish the aforementioned object, the present invention provides a display device including: a display panel having surface arrays of plural pixels for displaying an image by light radiation control on a pixel to pixel basis; an electronic component forming a control circuit configured to perform the light radiation control; a casing housing the display panel and the electronic component therein; a flat heat-conductive sheet interposed between the display panel and the casing and between the electronic component and the casing.

With the above-described construction, heat generated from the display panel and from the electronic component and the like is diffused in the plane of the flat heat-conductive sheet having an excellent thermal conductivity and then transferred to the casing. Therefore, a localized elevation in the temperature of the casing can be prevented. Also, the above-described construction has an advantage that the heat dissipation efficiency is enhanced as compared with the conventional construction in which a localized elevation in the temperature of the casing is inevitable.

In the above-described construction, the heat-conductive sheet and at least one of the display panel and the electronic component may be arranged to allow heat transfer to occur therebetween through first heat transfer means.

By arranging the display panel or the electronic component, which generates a large amount of heat, and the heat-conductive sheet to allow heat transfer to occur therebetween through the first heat transfer means, highly efficient heat transfer occurs from the display panel or the electronic component to the heat-conductive sheet, thereby inhibiting an elevation in the temperature of the display panel or the electronic component.

For example, the first heat transfer means are first heat transfer members interconnecting the heat-conductive sheet and at least one of the display panel and the electronic component. This arrangement enables the efficiency of heat transfer from the display panel or the electronic component to the heat-conductive sheet to be enhanced by a simple structure.

As an alternative example, the first heat transfer means have a first radiator member joined to at least one of the display panel and the electronic component, and a second radiator member joined to the heat-conductive sheet, the first heat transfer member being configured to radiate heat, the second radiator member being configured to absorb the heat radiated from the first radiator member.

This arrangement, which allows spatial heat transfer to occur by radiation-absorption of heat, makes it possible to reduce the size and weight of the heat transfer means. Since this arrangement allows heat transfer to occur through space, there can be obtained an additional merit that no consideration of insulation need be given.

In any one of the aforementioned arrangements of the display device, a back member can be provided on a rear of the display panel so as to extend along the plane of a rear of the display panel for uniformalizing the heat distribution over the display panel.

When a heat distribution occurs over the display panel, temperature differences among different regions of the display panel result in different amounts of secondary electron emission in the discharge cell, thus causing display irregularities to occur. However, the installation of the aforementioned back member, which acts to uniformalize the heat distribution over the display panel, makes it possible to inhibit the occurrence of display irregularities. If the back member provided on the rear of the display panel comprises a metal, the effect of improving the heat dissipation efficiency of the display panel can also be obtained.

In this case, the heat-conductive sheet and at least one of the back member and the electronic component may be arranged to allow heat transfer to occur therebetween through second heat transfer means. By arranging the back member which is heated to elevated temperatures and the heat-conductive sheet to allow heat transfer to occur therebetween through the second heat transfer means, highly efficient heat transfer from the back member to the heat-conductive sheet can be realized. It is therefore possible to inhibit an elevation in the temperature of the back member as well as to enhance the heat dissipation effect of the back member.

As one example, the aforementioned second heat transfer means are second heat transfer members interconnecting the back member and the heat-conductive sheet. This arrangement enables the efficiency of heat transfer from the back member to the heat-conductive sheet to be enhanced by a simple structure.

As an alternative example, the second heat transfer means have a third radiator member joined to the back member, and a fourth radiator member joined to the heat-conductive sheet, the third radiator member being configured to radiate heat, the fourth radiator member being configured to absorb the heat radiated from the third radiator member. This arrangement, which allows spatial heat transfer to occur by radiation-absorption of heat, makes it possible to reduce the size and weight of the heat transfer means. Since this arrangement allows heat transfer to occur through space, there can be obtained an additional merit that no consideration of insulation need be given.

The heat-conductive sheet used in the above-described arrangement is desirably an anisotropic heat-conductive member having a higher thermal conductivity in a plane thereof than in a thickness wise direction thereof from the viewpoint of uniformalization of the heat distribution over the surface of the casing. One example of such an anisotropic heat-conductive member is a sheet comprising graphite. Since graphite has an electromagnetic wave shielding property, the sheet provides the device with an enhanced shieldability against electromagnetic wave generated from the display panel and from the electronic component, thereby inhibiting electromagnetic wave generated within the casing from leaking out of the casing.

When the casing is vertically equally divided into an upper half and a lower half, the sum total of minimum cross-sectional areas of those first heat transfer means (or second heat transfer means) disposed in the lower half of the casing may be larger than the sum total of minimum cross-sectional areas of those first heat transfer means (or second heat transfer means) disposed in the upper half of the casing, the cross-sectional areas being the areas of cross sections of the first heat transfer means (or second heat transfer means) as viewed in the direction perpendicular to a heat transfer direction toward the casing.

The "upward" (opposite to the "downward") of the casing in the vertical direction of the casing means upward of the casing, comprising a rear wall, sidewalls, top wall and bottom wall, of the display device in a normal use condition and is opposite to the gravitational direction of the display device. Therefore, the upward and downward direction of the casing differs in sense between a display device to be installed in portrait orientation (an event information display device for example) when in a normal use condition and a display device to be installed in landscape orientation when in a normal use condition (a television receiver for example).

With such an arrangement, the degree of heating of the lower half of the casing by heat generated from the display panel and the electronic component and the degree of heating of the upper half of the casing by heat of high-temperature convected air warmed by heat exchange with the display panel and with the electronic component can be well balanced, whereby the heat distribution in the plane of the entire surface of the casing can be made uniform. Particularly, if a numerical value obtained by dividing the sum total of minimum cross-sectional areas of those first heat transfer means (or second heat transfer means) disposed in the lower half of the casing by the sum total of minimum cross-sectional areas of those first heat transfer means (or second heat transfer means) disposed in the upper half of the casing is not less than 1.5, the temperature distribution in the plane of the casing can be uniformalized suitably.

As one example, the first heat transfer means (or the second heat transfer means) are rod members each having one end contacting at least one of the display panel and the electronic component and an opposite end contacting the heat-conductive sheet.

As an alternative example, the first heat transfer means (or the second heat transfer means) are annular members each having a first portion contacting at least one of the display panel and the electronic component, a second portion contacting the heat-conductive sheet, and other portion than the first and second portions which is positioned to allow heat transfer to occur between the heat-conductive sheet and at least one of the display panel and the electronic component.

The casing may be provided with a first vent hole in the lower half thereof and a second vent hole in the upper half thereof. For example, it is possible that the first vent hole is an air intake hole provided in the lower half of the casing for taking air into the casing while the second vent hole is an air exhaust hole provided in the upper half of the casing for exhausting air out of the casing.

Also, it is possible that the display device further comprises a support member holding the display panel via the back member, and third heat transfer means configured to allow heat transfer to occur between the back member and the support member, the third heat transfer means forming part of the support member.

Such an arrangement allows heat generated from the display panel to be rapidly transferred to the casing through the support member, whereby the effect of uniformalizing the heat distribution in the plane of the casing is more suitably achieved.

Also, it is possible that the display device further comprises a support member holding the display panel via the back member, and fourth heat transfer means interconnecting the back member and the support member.

Such an arrangement allows heat generated from the display panel to be rapidly transferred to the support member through the fourth heat transfer means, whereby the effect of uniformalizing the heat distribution in the plane of the casing is more suitably achieved.

The first heat transfer means preferably have a thermal conductivity of not less than 80 J/msK from the viewpoint of rapid heat transfer. For this reason, the first heat transfer means comprise a material containing any one selected from the group consisting of aluminum, iron, copper, magnesium, silver, graphite and diamond.

One example of the display panel is a plasma display panel.

The foregoing and other objects, features and attendant advantages of the present invention will become more apparent from the reading of the following detailed description of the preferred embodiments in conjunction with the accompanying drawings.

EFFECT OF INVENTION

According to the present invention, a panel display device can be obtained which is capable of preventing the occurrence of a localized elevation in the temperature of the casing thereby uniformalizing the surface temperature distribution over the casing.

Figure 1:
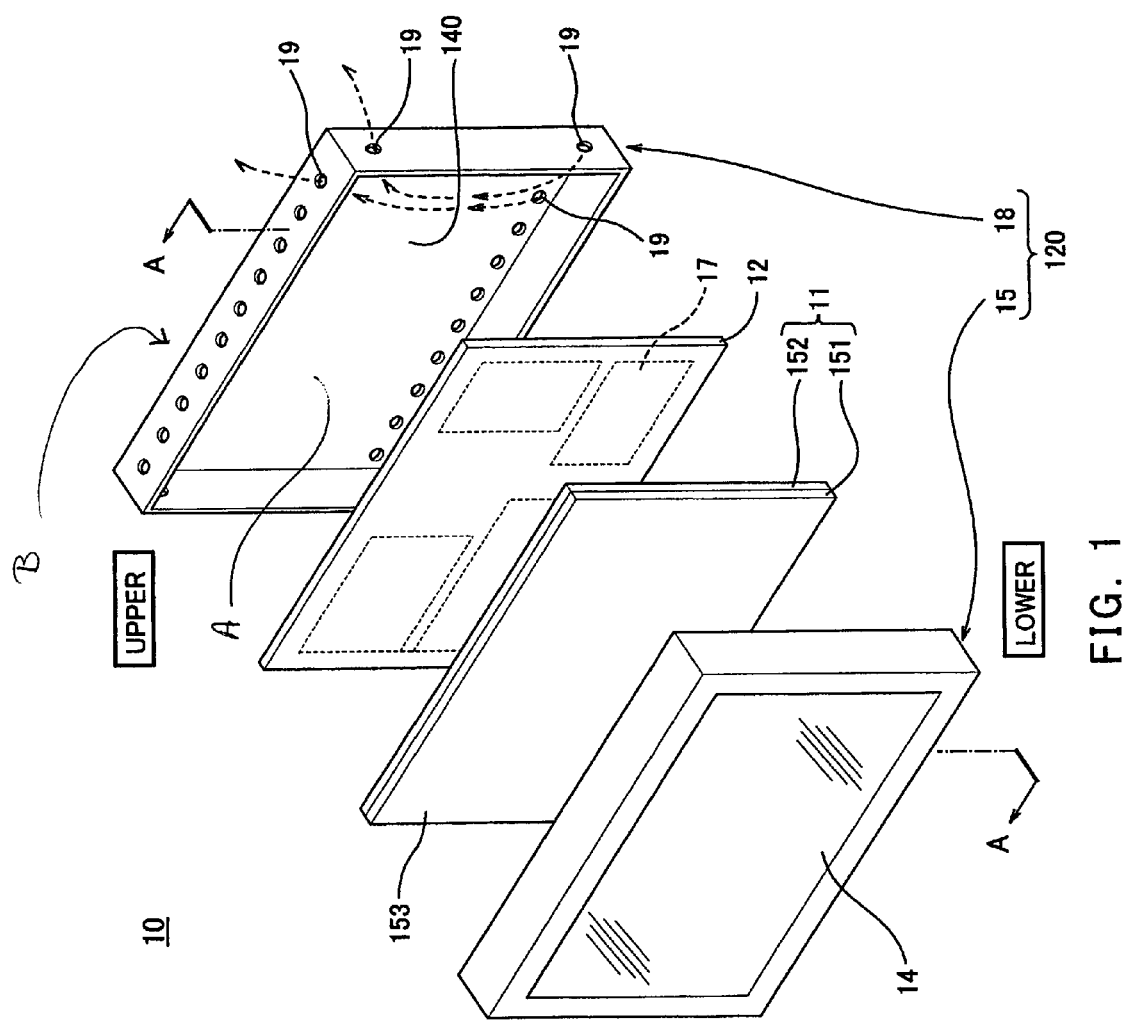
FIG. 1 is an exploded perspective view showing a plasma display device.

DESCRIPTION OF REFERENCE CHARACTERS 10,100,150,190,200,210,220,230 . . . plasma display device
11 . . . plasma display panel (PDP)
12 . . . chassis
17 . . . circuit board
13 . . . leg portion
14 . . . protective panel
15 . . . front cover
16 . . . electronic component
18 . . . back cover
19a,19b,19c . . . air intake hole
19d,19e . . . air exhaust hole
19f,19g . . . opening
20a,20b,20c,20d . . . rod-shaped heat transfer member
30,31 . . . annular heat transfer member
120 . . . casing
140,142 . . . graphite sheet
130,160 . . . analytical model

BEST MODE FOR CARRYING OUT INVENTION

Hereinafter, preferred embodiments of the present invention will be described with reference to the drawings.

First Embodiment

Initially, the construction of a plasma display device according to the first embodiment will be described with reference to FIG. 1. FIG. 1 is an exploded perspective view showing the plasma display device 10 according to the first embodiment. The plasma display device 10 includes a casing 120, a PDP (display panel) 11 housed in the casing 120, a chassis 12 (back member) as a metal support plate supporting the PDP 11, and a plurality of circuit boards 17 each integrated with a control circuit.

The PDP 11 comprises surface arrays of plural pixels for displaying an image by light radiation control on a pixel to pixel basis, and front and rear panels 151 and 152 positioned parallel with and opposite to each other. The front panel 151 comprises a front glass substrate formed with a display electrode pair, a dielectric layer and a protective layer in this order on a surface of the glass substrate facing the rear panel 152. On the other hand, the rear panel 152 comprises a rear glass substrate formed with an address electrode, a dielectric layer and partition walls applying a phosphor layer therebetween in this order on a surface of the rear glass substrate facing the front panel 151. In the phosphor layer, a sequence of red, green and blue is repeatedly arranged. The front panel 151 and the rear panel 152 are bonded to each other with sealant at their peripheral edge portions in such a manner as to define a clearance therebetween, which is in turn partitioned with a striped partition wall to define discharge spaces (not shown) each encapsulating a gas for discharge therein. The PDP 11 thus constructed displays an image on an image display screen 153 in response to signals from the control circuits of the respective circuit boards 17.

The chassis 12 is a plate member comprising aluminum for example. The chassis 12 and the rear panel 12 of the PDP 11 are bonded to each other with an adhesive having an excellent thermal conductivity such as silicone paste for example.

The chassis 12 positioned to extend along the rear face of the PDP 11 acts to uniformalize the heat distribution in the plane of the PDP 11, thereby making it possible to inhibit the occurrence of display irregularities. In addition, the installation of the chassis 12 on the rear of the PDP 11 can bring an advantage that the heat dissipation efficiency of the PDP 11 is enhanced.

Each circuit board 17 located on the rear of the chassis 12 comprises plural electronic components forming the control circuit integrated with the circuit board 17 for performing the light radiation control on a pixel to pixel basis.

The casing 120 comprises a front cover and a back cover 18, which are formed from aluminum for example. The front cover 15 and the back cover 18 are fitted to each other to form a single casing. The front cover 15 has a front defining an opening fitted with the protective panel 14 comprising glass for protecting the image display screen 153 of the PDP 11. A graphite sheet 140 (heat-conductive sheet) is affixed to the internal surface of the back cover 18 so as to cover the substantially entire internal surface comprising a major surface, upper and lower surfaces and right and left surfaces.

The graphite sheet 140, which is a sheet comprising graphite, has such an anisotropic thermal conductivity that the thermal conductivity in the plane thereof is higher than that in the thickness wise direction thereof. The graphite sheet 140 used in this embodiment is a graphite sheet having, for example, a thermal conductivity of 300 W/m·K in the plane thereof and a thermal conductivity of 20 W/m·K in the thickness wise direction thereof. The graphite sheet 140 includes a front surface A (e.g., a visible surface in FIG. 1) and a back surface B (e.g., an invisible surface in FIG. 1). The thickness wise direction includes a direction from the front surface A to the back surface B or vice versa.

The back cover 18 has plural air intake/exhaust holes 19 at appropriate portions thereof to allow air convection from lower portion to upper portion of the plasma display device 10 (see dotted arrows in FIG. 1) to occur for the purpose of dissipating high-temperature air residing in the internal space of the casing 120 of the plasma display device 10 to the outside. Examples of specific arrangements of these air intake/exhaust holes 19 will be described in relation to the third embodiment to be described later.

Figure 2:
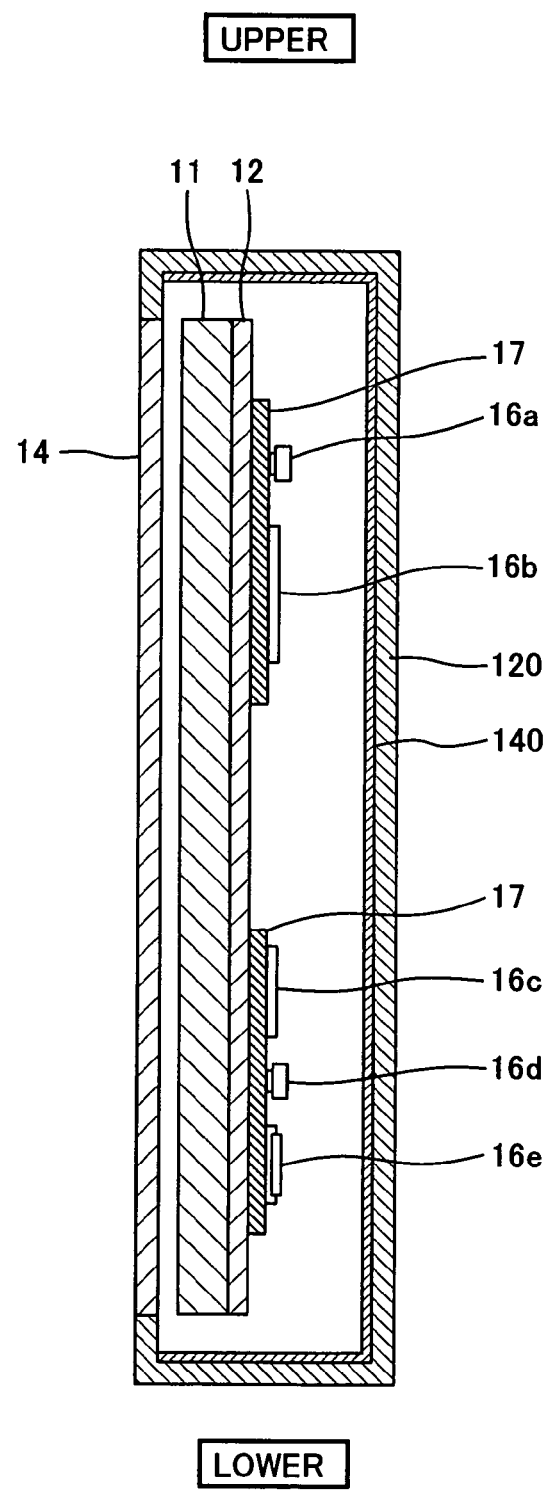
FIG. 2 is a sectional view, taken along line A-A indicated by arrow in FIG. 1, of the plasma display device.

The advantage of the plasma display device 10 will be described with reference to FIG. 2. FIG. 2 is a sectional view taken along line A-A indicated by arrow in FIG. 1. The PDP 11 is secured to the casing 120 in a section different from the section shown in FIG. 2.

Among the components of the plasma display device 10, major heat-generating components includes the PDP 11, electronic components 16a to 16e mounted on the circuit boards 17, and like components. Of these electronic components, a CPU, power transistors 16a and 16c and like components generate large amounts of heat.

As already described, a plasma display device of the conventional construction has the drawback that portions of the casing located adjacent such heat-generating components as the PDP, electronic components and the like are locally heated to elevated temperatures.

In contrast, the plasma display device 10 according to the present embodiment includes the graphite sheet 140 affixed to the internal surface of the casing 120 and having a thermal conductivity of 300 W/m·K in the plane thereof and a thermal conductivity of 20 W/m·K in the thickness wise direction thereof. This arrangement allows heat generated from the PDP 11 and from the electronic components 16a to 16e to be transferred to portions of the graphite sheet 140 located adjacent such heat-generating components through air, diffused in the plane of the graphite sheet 140, and then transferred to the entire region of the casing 120. Thus, it is possible to prevent the occurrence of a localized elevation in the temperature of the casing 120.

Also, since heat generated within the casing 120 is diffused all over the casing 120 in the plasma display device 10 according to the present embodiment, the heat dissipation efficiency of the casing 120 is enhanced as compared with the conventional construction which allows a localized elevation in the temperature of the casing 120 to occur.

When the temperature of the PDP 11 is elevated, charge is hard to retain under an addressing mode, which may cause a display failure to occur, thus resulting in impairment of image quality. However, the present embodiment, which is enhanced in heat dissipation efficiency, can inhibit the temperature of the PDP 11 from being elevated and hence enjoys an additional advantage that impairment of the image quality of the PDP 11 is not likely.

In addition, since the graphite sheet 140 achieves the effect of shielding electromagnetic wave, it is possible to inhibit electromagnetic waves generated from the PDP 11, electronic components 16a to 16e and the like from leaking out of the casing 120.

Second Embodiment

Figure 3:
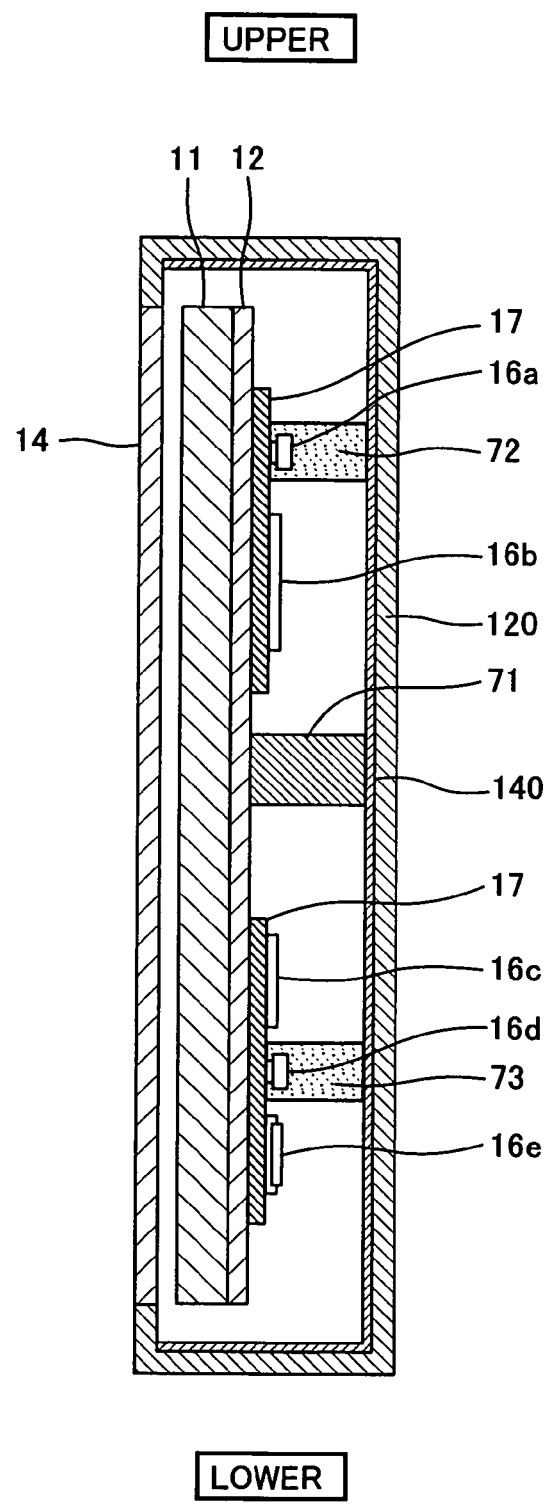
FIG. 3 is a sectional view showing one exemplary construction of a plasma display device according to a second embodiment.
Figure 4:
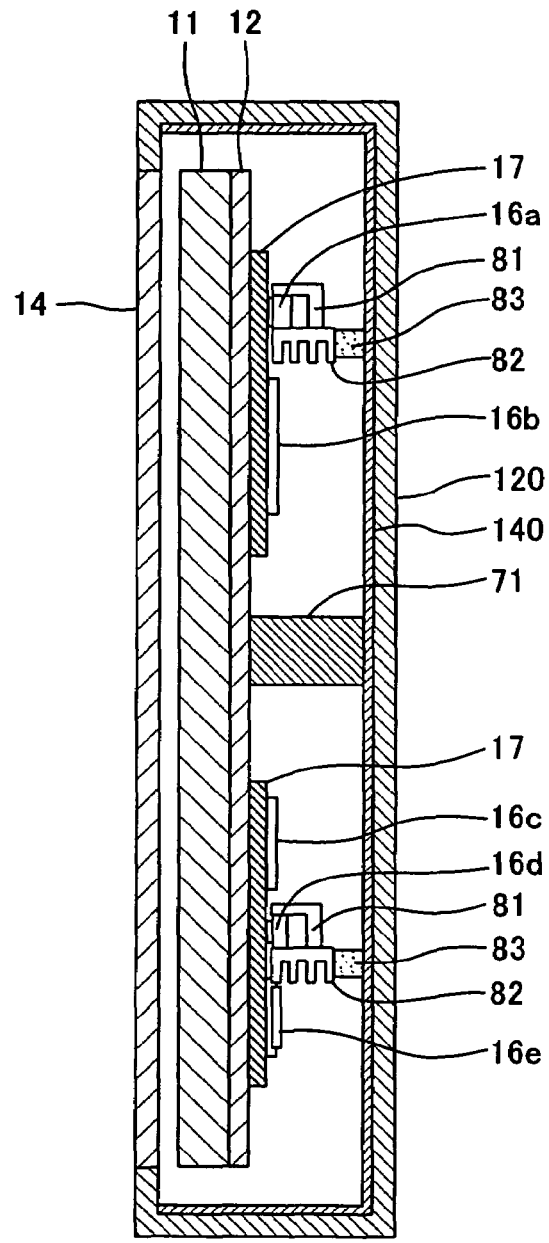
FIG. 4 is a sectional view showing another exemplary construction of the plasma display device according to the second embodiment.
Figure 5:
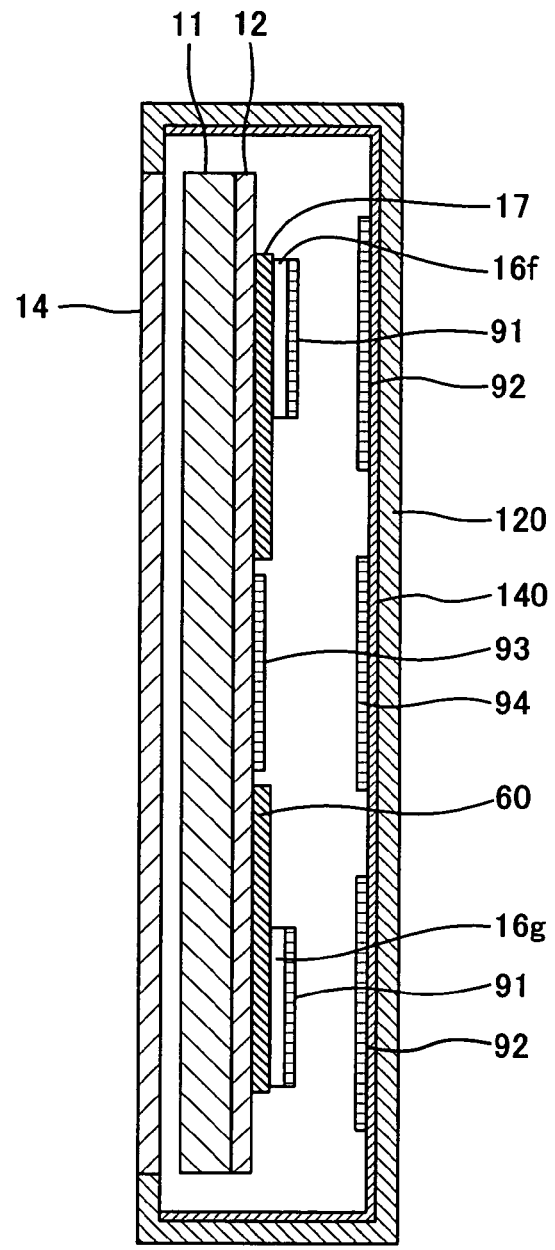
FIG. 5 is a sectional view showing another exemplary construction of the plasma display device according to the second embodiment.

With reference to FIGS. 3 to 5, description will be made of a plasma display device according to the second embodiment. The second embodiment has the same construction as the first embodiment except that the electronic component and the chassis are connected to the graphite sheet via heat transfer members. For this reason, emphasis will be placed on the different feature in the following description without description of shared features.

FIG. 3 is a sectional view showing one exemplary plasma display device according to the second embodiment.

In the plasma display device shown in FIG. 3, the chassis 12 of aluminum (or the display panel 11 joined to the chassis 12) and the graphite sheet 140 are interconnected via a heat transfer member 71 comprising aluminum. The joint areas between the heat transfer member 71 and the chassis 12 and between the heat transfer member 71 and the graphite sheet 140 have enhanced adhesion by application of silicone paste for example. It is desirable that the main heat transfer member interconnecting the chassis 12 and the graphite sheet 140 to allow heat transfer to occur therebetween be a rod member of aluminum and that material as to provide an intimate contact between the rod member and the chassis 12 and between the rod member and the graphite sheet 140, such as silicone resin (in the form of grease or sheet), be used to join one end of the rod member to the chassis 12 and the other end of the rod member to the graphite sheet 140.

The heat transfer member 71 thus positioned allows heat generated from the PDP 11 to be transferred through the chassis 12 and the heat transfer member 71 to the graphite sheet 140 highly efficiently, thereby making it possible to inhibit the temperature of the PDP 11 from being elevated.

If the chassis 12 and the heat transfer member 71 are formed from the same metal which is excellent in thermal conductivity (aluminum in this embodiment), the chassis 12 and the heat transfer member 71 can be formed integral with each other, which can lead to a reduced production cost.

In the plasma display device illustrated in FIG. 3, the power transistor 16a which generates a large amount of heat and the graphite sheet 140 are interconnected via silicone rubber 72 used as a heat transfer member. The joint areas between the silicone rubber 72 and the power transistor 16a and between the silicone rubber 72 and the graphite sheet 140 have enhanced adhesion by application of silicone paste for example.

When an elastic member having an excellent thermal conductivity, such as the silicone rubber 72, is joined to the power transistor 16a, a vibration shock that is unexpectedly applied to the plasma display device 10 can be dampened at the power transistor 16a much more than in cases where a heat transfer member comprising a metal having inferior flexibility is joined to the power transistor 16a.

The silicone rubber 72 thus positioned allows heat generated from the power transistor 16a to be transferred therethrough to the graphite sheet 140 highly efficiently, thereby making it possible to inhibit the temperature of the power transistor 16a from being elevated. Likewise, the electronic component 16d and the graphite sheet 140 are interconnected via silicone rubber 73, thereby making it possible to inhibit the temperature of the electronic component 16d from being elevated.

FIG. 4 is a sectional view showing another exemplary plasma display device according to the second embodiment which is different in construction from the plasma display device shown in FIG. 3.

In the plasma display device illustrated in FIG. 4, the power transistor 16a is held between a metal leaf 81 and a metal radiator plate 82 comprising aluminum and having a radiator fin. The metal radiator plate 82 and the graphite sheet 140 are interconnected via silicone rubber 83 joined thereto with enhanced adhesion. Since this construction is described in Japanese Patent Laid-Open Publication No. 2000-338904, detailed description thereof will be omitted.

With the construction shown in the figure, the heat dissipation efficiency of the electronic component 16a is improved by heat transfer to the metal radiator plate 82 of a high thermal conductivity having the radiator fin and, hence, an elevation in the temperature of the electronic component 16a is hard to occur.

Likewise, the electronic component 16d is also held between the metal leaf 81 and the metal radiator plate 82. The metal radiator plate 82 and the graphite sheet 140 are interconnected via silicone rubber 83. Thus, an elevation in the temperature of the electronic component 16d can be inhibited.

FIG. 5 is a sectional view showing another exemplary plasma display device according to the second embodiment which is different in construction from the plasma display devices shown in FIGS. 3 and 4.

In the plasma display device illustrated in FIG. 5, a ceramic sheet 91 having a high emissivity is affixed to the surface of a CPU 16f mounted on the circuit board 17. Also, a ceramic sheet 92 is affixed to a region of the surface of the graphite sheet 140 located opposite to the ceramic sheet 91.

With this arrangement, heat generated from the CPU 16f is transferred to the ceramic sheet 91, which in turn radiates the heat as infrared rays. The infrared rays thus radiated are mainly absorbed by the ceramic sheet 92 located opposite to the ceramic sheet 91 and then transferred as heat from the ceramic sheet 92 to the graphite sheet 140. In this way, heat generated from the CPU 16f is transferred to the graphite sheet 140 highly efficiently and, hence, an elevation in the temperature of the CPU 16f can be inhibited.

A ceramic sheet 93 is affixed to a predetermined region of the chassis 12. Also, a ceramic sheet 94 is affixed to a region of the surface of the graphite sheet 140 located opposite to the ceramic sheet 93.

With this arrangement, heat generated from the PDP 11 and transferred to the chassis 12 is transferred to the ceramic sheet 93 and then radiated as infrared rays. The infrared rays thus radiated are mainly absorbed by the ceramic sheet 94 located opposite to the ceramic sheet 93 and then transferred as heat from the ceramic sheet 94 to the graphite sheet 140. In this way, heat generated from the PDP 11 is transferred to the graphite sheet 140 highly efficiently and, hence, an elevation in the temperature of the PDP 11 can be inhibited.

In the case where the chassis 12 is formed from a metal, the heat emissivity of the chassis 12 can be improved by matte-finishing of the surface thereof. In view of this effect, it is possible to employ an alternative arrangement wherein instead of the installation of the ceramic sheet 93, the surface of the chassis 12 is matte-finished to allow the chassis 12 to radiate heat as infrared rays, which are then absorbed by the ceramic sheets 92 and 94, thereby transferring heat from the chassis 12 to the graphite sheet 140.

In further enhancing the heat emissivity, it is advantageous to blacken the surface of the chassis 12 in addition to the matte-finishing. Heat is highly efficiently radiated from the blackened region of the chassis 12, and then absorbed by the ceramic sheets 92 and 94 affixed to the graphite sheet 140, and then transferred to the graphite sheet 140.

If the chassis 12 is formed from aluminum for example, a blackened ALMITE treatment to the surface of the chassis 12 is advantageous in enhancing the heat emissivity of the chassis 12.

By employing the arrangement for spatially transferring heat by radiation/absorption of heat as shown in FIG. 5 instead of the arrangement for heat transfer through the heat transfer members as shown in FIG. 3 or 4, the heat transfer means for transferring heat can be reduced in size and weight.

While the plasma display devices shown in FIGS. 3 and 4 have to be designed so that the heat transfer members 71 to 73, 82 and 83 and the like are each insulated from the control circuit, the arrangement for spatial heat transfer using the ceramic sheets and the like has the merit that insulation need not be taken into consideration.

In each of the devices shown in FIGS. 3 to 5, the graphite sheet 140 affixed to the internal surface of the casing 120 has a thermal conductivity of 300 W/m·K in the plane thereof and a thermal conductivity of 20 W/m·K in the thickness wise direction thereof. This feature allows heat generated from the PDP 11 and from the electronic components 16a, 16d, 16f and 16g to be transferred to the graphite sheet 140 by the aforementioned heat transfer means, subsequently diffused in the plane of the graphite sheet 140 and then transferred to the entire region of the casing 120, thus inhibiting a localized elevation in the temperature of the casing 120. Particularly, in the case of the conventional design concept that heat generated from the PDP 11 and from the electronic components 16a, 16d, 16f and 16g is intentionally concentrated on the aforementioned heat transfer means having an excellent thermal conductivity so as to be dissipated toward the casing 120 rapidly, a automatic demerit arises such that portions of the casing 120 located adjacent the heat transfer means are likely to be heated to elevated temperatures locally. The demerit can be advantageously improved by the use of the graphite sheet 140 according to the present embodiment.

Also, since heat generated within the casing 120 is diffused all over the casing 120 in the plasma display device 10 according to the present embodiment, the heat dissipation efficiency of the casing 120 is enhanced as compared with the conventional construction which allows a localized elevation in the temperature of the casing 120 to occur.

When the temperature of the PDP 11 is elevated, charge is hard to retain under an addressing mode, which may cause a display failure to occur, thus resulting in impairment of image quality. However, the present embodiment, which is enhanced in heat dissipation efficiency, can inhibit the occurrence of an elevation in the temperature of the PDP 11 and hence enjoys an additional advantage that impairment of the image quality of the PDP 11 is not likely.

In addition, since the graphite sheet 140 achieves the effect of shielding electromagnetic wave, it is possible to inhibit electromagnetic waves generated from the PDP 11, electronic components 16a to 16g and the like from leaking out of the casing 120.

Variations of the First and Second Embodiments

The present invention is not limited to the specific examples according to the first and second embodiments described above. For example, the following variations (1) to (6) are conceivable.

(Variation 1)

Figure 6:
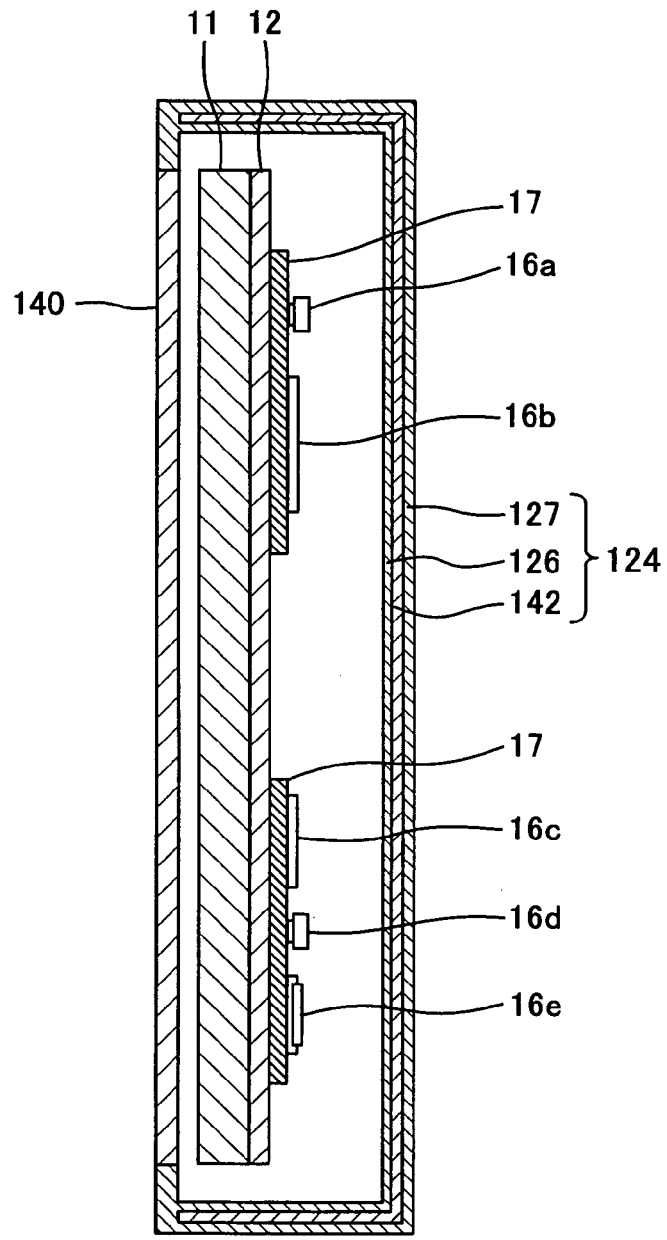
FIG. 6 is a sectional view showing a plasma display device according to a variation of the first and second embodiments.

While the graphite sheet 140 is affixed to the internal surface of the casing 120 as shown in, for example, FIG. 2 according to the foregoing description, an alternative arrangement can be employed wherein a graphite sheet 142 is embedded in a casing 124 as shown in FIG. 6. If the graphite sheet 142 is embedded inside the casing 124, the casing 124 can advantageously prevent graphite powder from scattering from the graphite sheet 142 toward the circuit boards 17.

With the arrangement having the graphite sheet 142 embedded in the casing 124 as shown in FIG. 6, heat generated from the PDP 11 and from the electronic components 16a to 16e and the like is transferred to the graphite sheet 142 through an inner surface portion 126 of the casing 124, diffused in the plane of the graphite sheet 142, and then transferred to the entire region of an outer surface portion 127 of the casing 124. In brief, the plasma display device according to this variation (1) has the graphite sheet 142 interposed between the outer surface portion 127 and the PDP 11 and between the outer surface portion 127 and the electronic components 16a to 16e.

Thus, it is possible to inhibit a localized elevation in the temperature of the outer surface of the casing 124. If a new sheet element is developed in future which has such an anisotropic thermal conductivity that the thermal conductivity in the plane is higher than that in the thickness wise direction as well as a mechanical strength required of the casing 120 of the plasma display device, the use of the sheet element for the casing 120 will make it possible to inhibit a localized elevation in the temperature of the casing 120 as well as to enhance the heat dissipation efficiency of the casing 120.

(Variation 2)

While the graphite sheet 140 is affixed to the internal surface of the casing 120 as shown in FIG. 2 according to the foregoing description, an alternative arrangement may be employed wherein the graphite sheet is opposed to the internal surface of the casing 120. With this arrangement, heat transferred to the graphite sheet is diffused in the plane of the graphite sheet, and then transferred to the entire region of the casing 120 through the intervening space. Thus, it is possible to inhibit a localized elevation in the temperature of the casing 120.

(Variation 3)

While the graphite sheet 140 is affixed to cover the entire internal surface of the casing 120 according to the foregoing description, the graphite sheet 140 need not necessarily cover the entire internal surface of the casing 120.

(Variation 4)

While the chassis 50 of aluminum is positioned on the rear of the PDP 11 to uniformalize the heat distribution over the PDP 11 according to the foregoing description, an alternative arrangement may be employed wherein instead of the installation of the chassis 50, a graphite sheet may be affixed to surface of the rear panel 52 of the PDP 11. With this arrangement, the heat distribution over the PDP 11 can be uniformalized because the graphite sheet has a high thermal conductivity.

(Variation 5)

While the above-described arrangements shown in FIGS. 3 to 5 according to the second embodiment are different from each other in heat transfer means for transferring heat from the PDP 50, the chassis 12 and the electronic components 16a to 16g and the like to the graphite sheet 140, the heat transfer means shown in respective of FIGS. 3 to 5 may be combined.

For example, it is possible to employ an arrangement wherein in the arrangement shown in FIG. 2, the electronic component 16a and the graphite sheet 140 are interconnected via the silicone rubber 72 as shown in FIG. 3; the electronic component 16d and the graphite sheet 140 are interconnected via the combination of the metal leaf 81, the metal radiator plate 82 and the silicone rubber 83 as shown in FIG. 4; and the chassis 12 and the graphite sheet 140 are provided with respective of opposite ceramic sheets 93 and 94 as shown in FIG. 5 for allowing heat transfer to occur therebetween.

(Variation 6)

While the foregoing description is directed to plasma display devices as display devices of the type using a flat display panel, the present invention is applicable not only to such plasma display devices but also to any display device which allows a localized elevation in the temperature of the casing to occur, for example, liquid crystal display devices, FED (Field Emission Display) devices and like display devices. When applied to these devices, the present invention is capable of inhibiting a localized elevation in the temperature of the casing while obtaining the advantage of enhanced heat dissipation effect. Further, the present invention can bring an additional advantage of being capable of shielding electromagnetic wave generated within the casing by the use of the graphite sheet as a sheet-shaped heat transfer member having anisotropy in thermal conductivity.

Third Embodiment

Hereinafter, the third embodiment of the present invention will be described with reference to the drawings.

Figure 7:
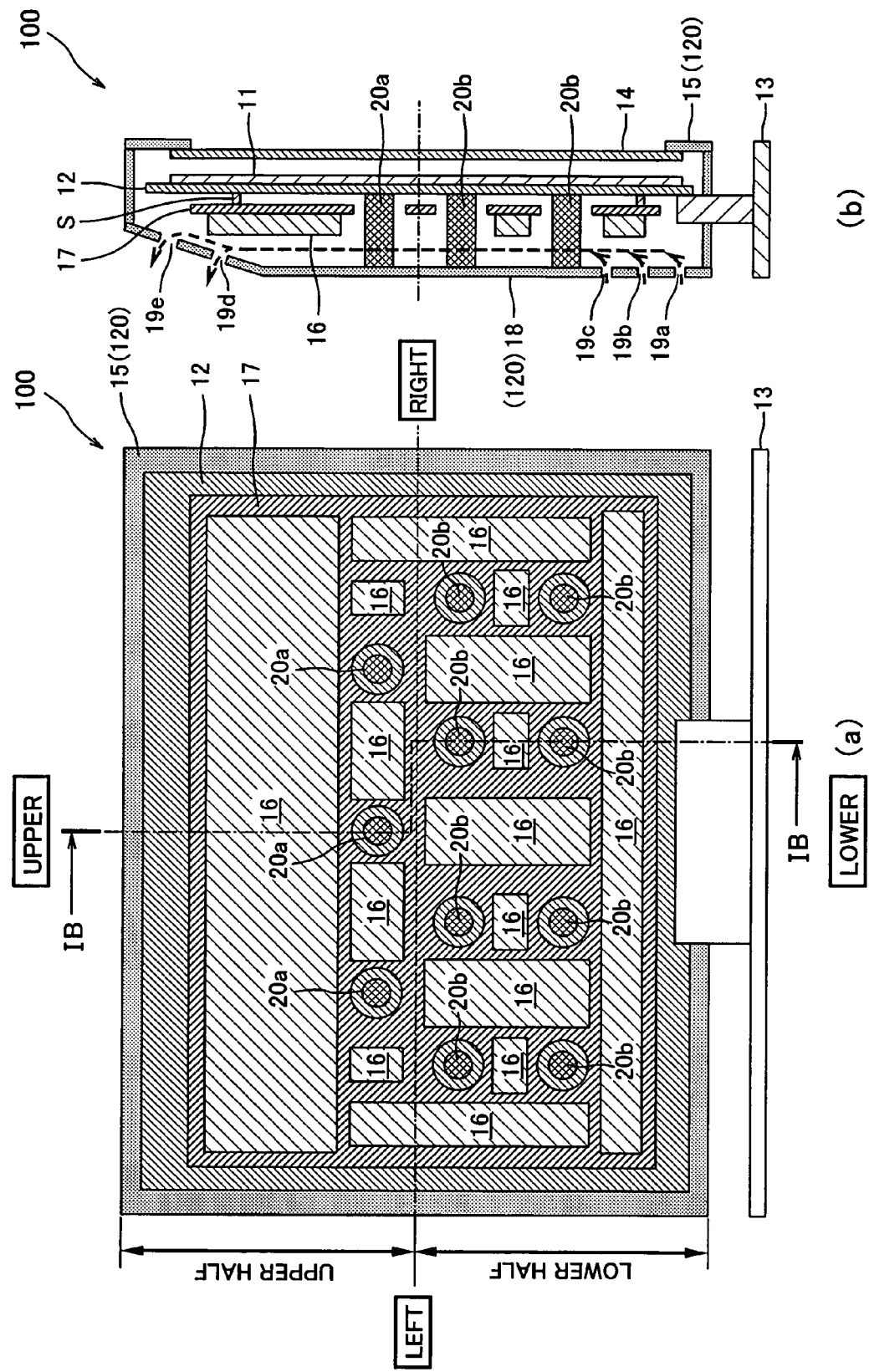
FIG. 7 is a sectional view showing one exemplary construction of a plasma display device according to a third embodiment of the present invention.

FIG. 7 is an illustration showing one exemplary construction of a plasma display device according to this embodiment. Specifically, FIG. 7(a) is a rear elevational emissivity view showing the plasma display device as viewed from behind and FIG. 7(b) is a sectional view, taken along line IB-IB of FIG. 7(a), of the plasma display device. Note that FIG. 7(a) shows the plasma display device in a condition where the back cover 18 to be described later is omitted (hereinafter, the same applies to FIGS. 9, 11, 12 and 15 to 19.)

For convenience, elements or components of the present embodiment which function like the corresponding elements or components already described in the First and Second Embodiments are each given the same reference character and the same name.

According to FIG. 7, the PDP 11 of a substantially rectangular shape is joined on the rear thereof with the chassis 12 (back member) of a substantially rectangular shape, which is positioned to fix the PDP 11. The chassis 12 together with the PDP 11 is fixed to a leg portion 13 serving as a pedestal of the plasma display device 100.

A front cover 15 (forming part of the casing 120 of the plasma display device 100) has an opening matching the display surface of the PDP 11. The protective panel 14, which serves as an optical filter comprising an electromagnetic wave shielding sheet, a color correction film, reinforced glass and the like, is attached to the front cover 15 so as to fit the opening. Thus, the plasma display device 100 is capable of electromagnetic wave shielding, chromatic purity adjustment and external shock protection. The protective panel 14 may be bonded directly to the obverse of the PDP 11.

On the rear of the chassis 12, the circuit board 17 carrying the electronic components 16 including a driver LSI for driving the PDP 11 and like components is fixed in position to the chassis 12 via an appropriate spacer S.

The back cover 18 (forming part of the casing 120 of the plasma display device 100) is positioned to cover the rears of the chassis 12 and circuit board 17 as well as the rear of the PDP 11 opposite away from the display surface of the PDP 11. The back cover 18, together with the front cover 15, functions as a designed casing of the plasma display device 100.

The back cover 18 is mounted on the leg portion 18 and joined with the front cover 15 by appropriate fastening means (such as adhesive, mechanical fit or the like).

The back cover 18 is provided at appropriate portions thereof in an upper portion of the plasma display device 100 with substantially circular or rectangular air exhaust holes 19d and 19e (air vent holes) for exhausting air from the inside of the plasma display device 100.

The back cover 18 is also provided at appropriate portions thereof in a lower portion of the plasma display device 100 with substantially circular or rectangular air intake holes 19a to 19c (air vent holes) for taking air into the plasma display device 100.

Thus, air taken into the plasma display device 100 through the air intake holes 19a to 19c is warmed within the plasma display device 100 by conducting heat away from the PDP 11 and the electronic components 16 based on heat exchange therewith and then exhausted to the outside of the plasma display device 100 through the air exhaust holes 19d and 19e along a path depicted by dotted line in FIG. 7(b) by air convection based on the principle of ascending force of air warmed in the upper portion of the back cover 18.

The plasma display device may have an arrangement wherein an appropriate air fan is provided for forcibly causing air convection to occur. The air fan may allow the air intake holes 19a to 19c to use as air exhaust holes and allow the air exhaust holes 19d and 19e to use as air intake holes. The arrangement may be advantageous depending on layout of the electronic components. Conceivably, it is desirable that air warmed by such forced air convection be exhausted from the lower portion of the plasma display device when such warmed air is utilized for room heating.

The "inside" of the plasma display device 100, as used herein, is meant by a region on the side on which the center of gravity of the plasma display device 100 lies. The region is designed to exist from the center of the section of the back cover 18 of the plasma display device 100 shown in FIG. 7(b) toward the side on which the electronic components 16 and the like are located.

In this embodiment, a plurality of cylindrical rod-shaped heat transfer members 20a and 20b (heat transfer means or rod members) are disposed at suitable places inside the plasma display device 100 in such a manner that one-side ends of these rod-shaped heat transfer members 20a and 20b are brought into thermal contact with the PDP 11 (exactly speaking, the one-side ends of the rod-shaped heat transfer members 20a and 20b are in contact with the PDP 11 via the chassis 12) while the other-side ends thereof are brought into thermal contact with the rear of the back cover 18 for the purpose of efficiently dissipating heat from the PDP 11 to the back cover 18. More specifically, each of the rod-shaped heat transfer members 20a and 20b extends from the contact position at which the one-side end thereof is in contact with the PDP 11 toward the back cover 18 in the thickness wise direction of the plasma display device through a hole formed in the circuit board 17 with no contact with the circuit board 17 or any one of the electronic components 16 mounted on the circuit board 17 until the other-side end thereof is brought into contact with the rear of the back cover 18.

One exemplary arrangement of the rod-shaped heat transfer members 20a and 20b in the plane of the back cover 18 is shown in FIG. 7(a). When the back cover 18 is vertically equally divided into an upper half and a lower half, three rod-shaped heat transfer members 20a which interconnect the rear of the upper half of the back cover 18 and the PDP 11 to allow heat transfer to occur therebetween are arranged side by side horizontally of the plasma display device 100 in a region corresponding to the upper half of the back cover 18 (hereinafter will be simply referred to as the upper half), while eight rod-shaped heat transfer members 20b which interconnect the rear of the lower half of the back cover 18 and the PDP 11 to allow heat transfer to occur therebetween are arranged in upper and lower two rows each comprising of four rod-shaped heat transfer members 20b arranged side by side horizontally of the plasma display device 100 in a region corresponding to the lower half of the back cover 18 (hereinafter will be simply referred to as the lower half).

That is, the rod-shaped heat transfer members 20a and 20b are distributed at suitable places inside the plasma display device 100 so that the total number of the rod-shaped heat transfer members 20b thermally connected to the lower half of the back cover 18 is larger than the total number of the rod-shaped heat transfer members 20b thermally connected to the upper half of the back cover 18.

With such an arrangement of the rod-shaped heat transfer members 20a and 20b in the plane of the back cover 18, the major part of heat generated from the lower half of the PDP 11 is transferred to the lower half of the back cover 18 through the rod-shaped transfer members 20b. Stated otherwise, heat generated from the lower half of the PDP 11 is rapidly transferred to the lower half of the back cover 18 prior to heat exchange with air taken into the plasma display device 150 through the air intake holes 19a to 19c and flowing toward the air exhaust holes 19a by air convection. Such heat transfer works to inhibit an elevation in the temperature of air ascending within the plasma display device 150 by air convection, thus suitably preventing the occurrence of an elevation in the surface temperature of the upper half of the back cover 18, which has hitherto been problematic.

The inventors of the present invention consider that the heat distribution in the plane of the entire back cover 18 can be uniformalized because the degree of heating of the lower half of the back cover 18 by heat generated from the PDP 11 is well balanced with the degree of heating of the upper half of the back cover 18 by heat of high-temperature convected air warmed by heat exchange with the electronic components 16 and the like by virtue of the arrangement of the rod-shaped heat transfer members 20a and 20b in the plane of the back cover 18 wherein the total number of the rod-shaped heat transfer members 20b in contact with the lower half of the back cover 18 is larger than the total number of the rod-shaped heat transfer members 20a in contact with the upper half of the back cover 18.

In addition, any one of the circuit board 17 and the electronic components 16 mounted thereon is not joined to any one of the rod-shaped heat transfer members 20a and 20b in the arrangement of the rod-shaped heat transfer members 20a and 20b shown in FIG. 7(b) and, hence, direct heat transfer between the PDP 11 and the circuit board 17 (particularly, the electronic components 16 mounted on the circuit board 17) is cut off. For this reason, heat generated from the circuit board 17 (particularly, the electronic components 16 mounted on the circuit board 17) is dissipated by heat exchange with convected air flowing inside the plasma display device 100. On the other hand, heat transfer from the circuit board 17 to the PDP 11 is properly cut off. (Usually, the amount of heat generated by the electronic components 16 is larger than that of heat generated by the PDP 11.) Thus, it is expected that any thermal damage to the PDP 11 (thermal deterioration of the phosphor for example) by heat generated from the circuit board 17 (particularly, the electronic components 16 mounted on the circuit board 17) can be prevented properly.

Further, the effect of uniformalizing the heat distribution in the plane of the back cover 18 obtained by the present embodiment makes a proper heat dissipation design for the plasma display device 100 possible if air exhaust or intake fans are reduced in number or eliminated. Accordingly, such advantages will result that a noise problem with the plasma display device 100 caused by such fans can be eliminated and the cost and electric power needed for the installation of fans can be saved.

Figure 8:
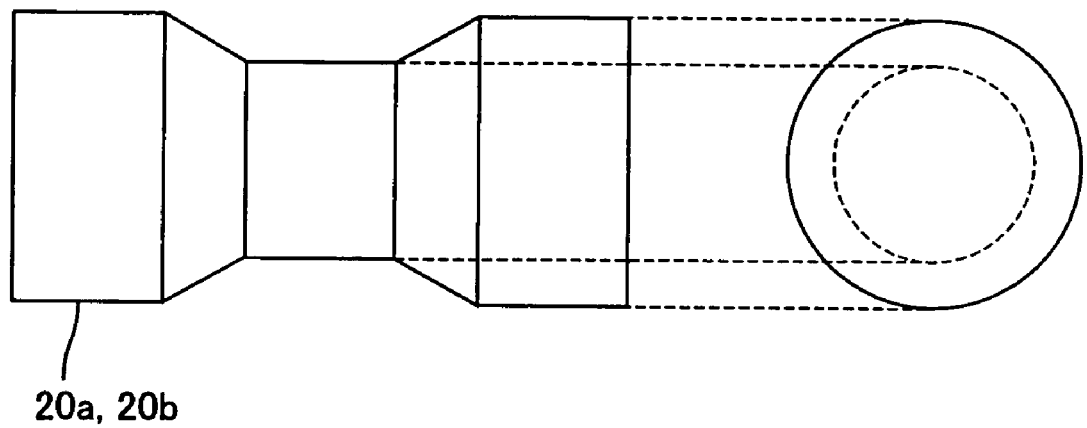
FIG. 8 is an illustration showing one exemplary rod-shaped heat transfer member having a variant shape along the longitudinal direction corresponding to the heat transfer direction.

In this embodiment, each of the cylindrical rod-shaped heat transfer members 20a and 20b need not necessarily have an invariant cross-sectional shape along the longitudinal axis thereof which corresponds to the heat transfer direction. FIG. 8 illustrates one example of such a cylindrical rod-shaped heat transfer member. In FIG. 8, the left-hand figure is a view showing this rod-shaped heat transfer member as viewed along the longitudinal axis thereof, while the right-hand figure is a view showing the rod-shaped heat transfer member as viewed in the direction perpendicular to the longitudinal axis. The rod-shaped heat transfer member 20a, 20b shown in FIG. 8 has a longitudinally central portion thinned to have a minimum cross-sectional area.

The inventors of the present invention have calculated a proper ratio between the rod-shaped heat transfer members 20a joined to the upper half of the back cover 18 (see FIG. 7) and the rod-shaped heat transfer members 20b joined to the lower half of the back cover 18 (see FIG. 7) while taking into consideration the case where each of the rod-shaped heat transfer members has a cross-section cut perpendicularly to the longitudinal axis thereof (heat transfer direction) that varies along the longitudinal axis (heat transfer direction) thereof, to establish the following criterion of judgment for obtaining the effect of uniformalizing the heat distribution in the plane of the back cover 18.

In the case where a rod-shaped heat transfer member having varying cross-section along the heat transfer direction, a portion of the heat transfer member having a cross-section with a minimum cross-sectional area of cross-sections that are continuous along the heat transfer direction (for example, a longitudinally central portion of the rod-shaped heat transfer member 20a, 20b shown in FIG. 8) can be considered to be a region dominating the amount of heat transfer based on heat conduction of the rod-shaped heat transfer member 20a, 20b. The effect of uniformalizing the heat distribution in the plane of the back cover 18, which is brought about by the installation of such a rod-shaped heat transfer member, is expected to result when the amount of heat transfer between the lower half of the PDP 11 and the rear of the back cover 18 in the lower half of the back cover 18 is made larger than the amount of heat transfer between the upper half of the PDP 11 and the rear of the back cover 18 in the upper half of the back cover 18.

More generally speaking, when the back cover 18 is vertically equally divided into the upper half and the lower half, the sum total of minimum cross-sectional areas of the rod-shaped heat transfer members 20b disposed in the lower half of the back cover 18 is made larger than the sum total of minimum cross-sectional areas of the rod-shaped heat transfer members 20a disposed in the upper half of the back cover 18, the cross-sectional areas being the areas of cross-sections of the rod-shaped heat transfer members 20a and 20b as viewed in the direction perpendicular to the heat transfer direction toward the back cover 18. By so doing, the effect of uniformalizing the heat distribution in the plane of the back cover 18 according the present embodiment can be achieved.

The material to be used for the rod-shaped heat transfer members 20a and 20b shown in FIG. 7 is desirably a material having a thermal conductivity of more than 80 J/msK from the viewpoint of rapid heat transfer. Examples of specific materials for the rod-shaped heat transfer members 20a and 20b include aluminum (thermal conductivity: 237 J/msK), iron (80.4 J/msK), copper (401 J/msK), magnesium (156 J/msK), silver (429 J/msK), graphite (parallel with layers) (1960 J/msK), and diamond (1360 to 2320 J/msK). (These values of thermal conductivity are referred to "DICTIONARY OF PHYSICS", edited by the committee for edition of DICTIONARY OF PHYSICS, BAKFUKAN CO., LTD. (1986).)

By using the thermofluid simulation technology, the effect of uniformalizing the heat distribution in the plane of the back cover 18 according the present embodiment has been verified.

Analytical Model

Figure 9:
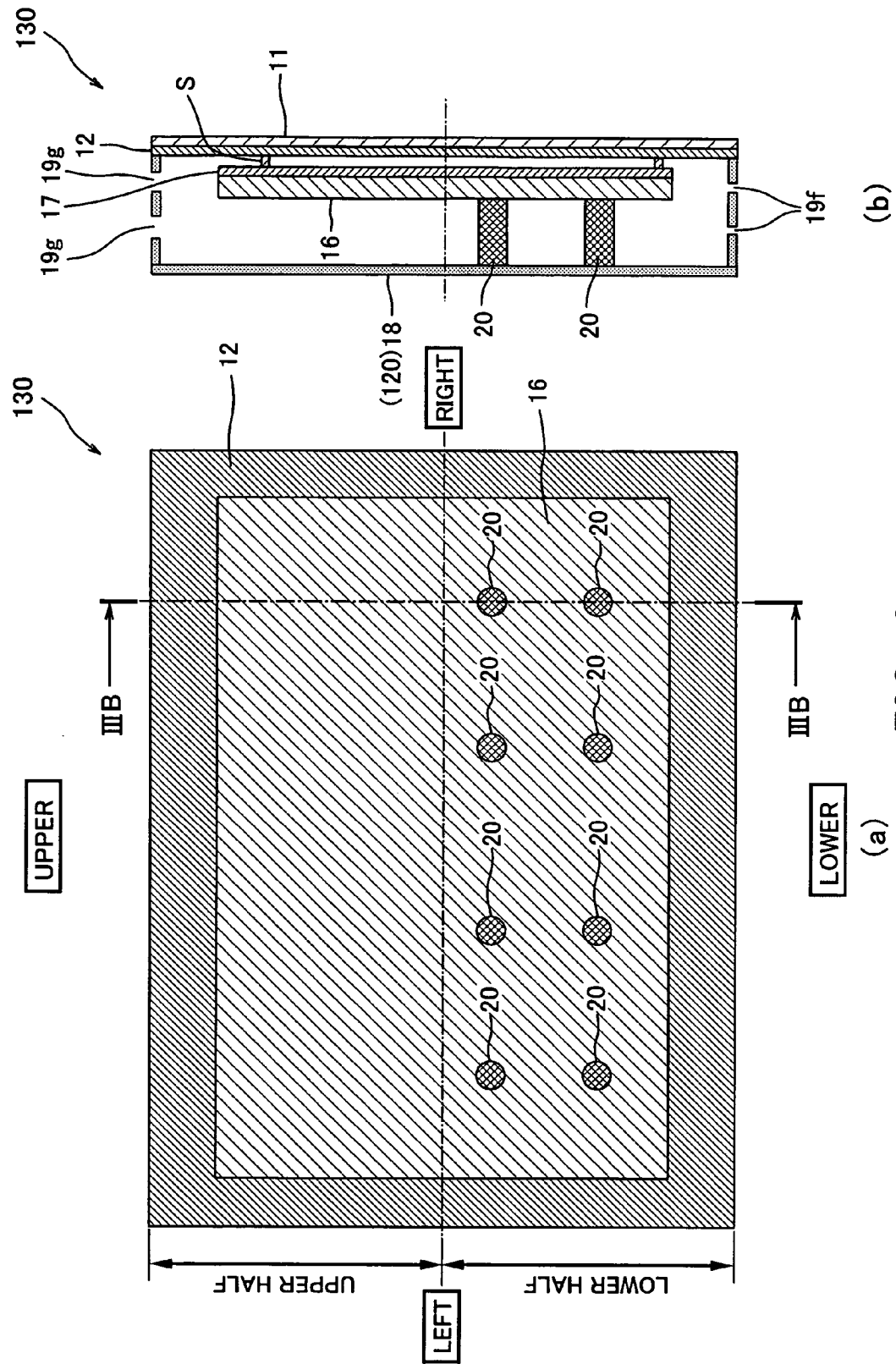
FIG. 9 is an illustration three-dimensionally modeling the plasma display device according to the third embodiment for numerical calculation.

FIG. 9 is an illustration three-dimensionally modeling the plasma display device of FIG. 7 according to the present embodiment for numerical calculation, wherein only the rod-shaped heat transfer members 20b disposed inside the plasma display device 100 of FIG. 7 are modeled for analysis. Specifically, FIG. 9(a) is a rear elevational view showing the analytical model of the plasma display device as viewed from behind and FIG. 9(b) is a sectional view, taken along line IIIB-IIIB of FIG. 9(a), of the analytical model.

Figure 11:
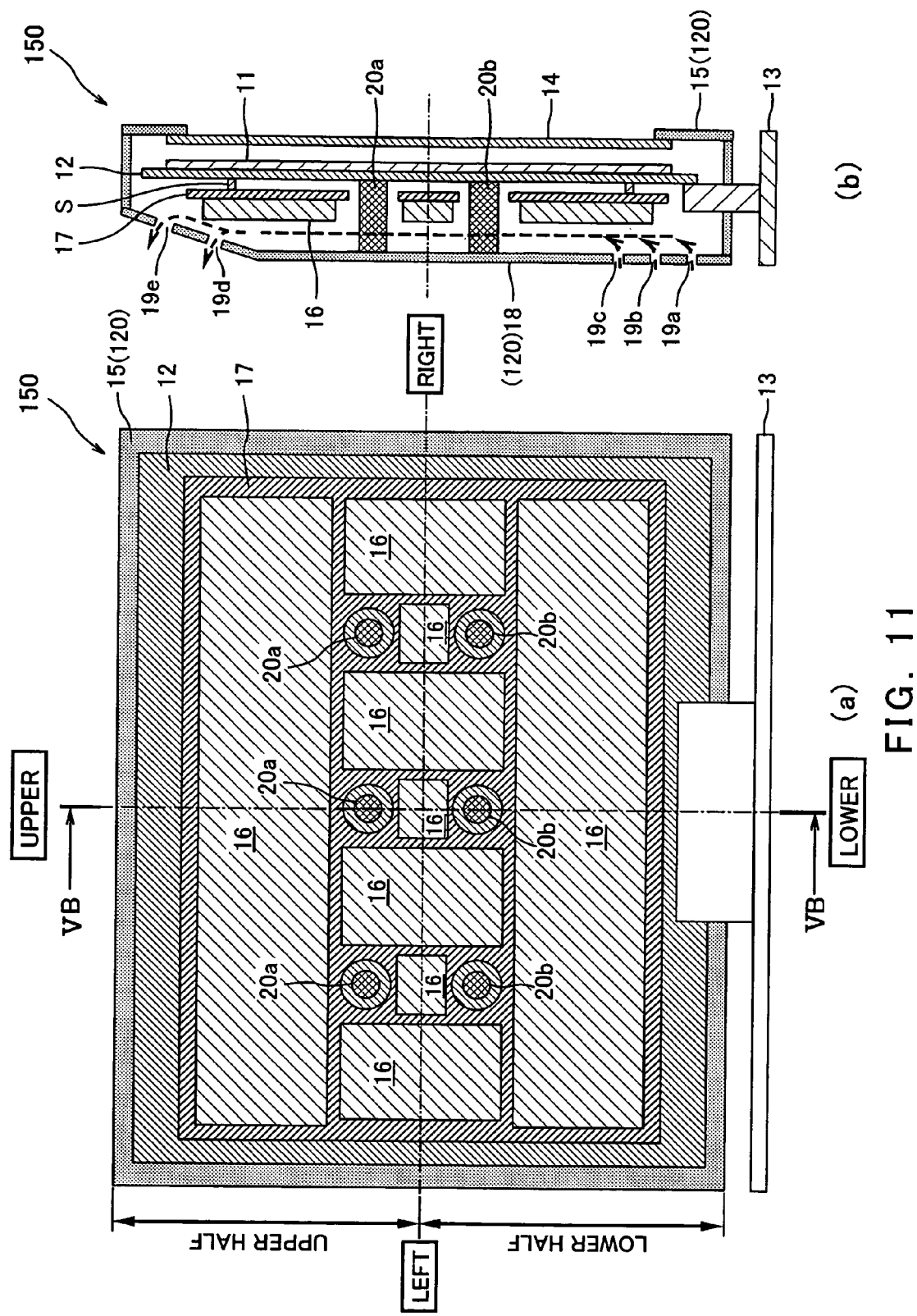
FIG. 11 is an illustration showing one exemplary construction of a conventional plasma display device.
Figure 12:
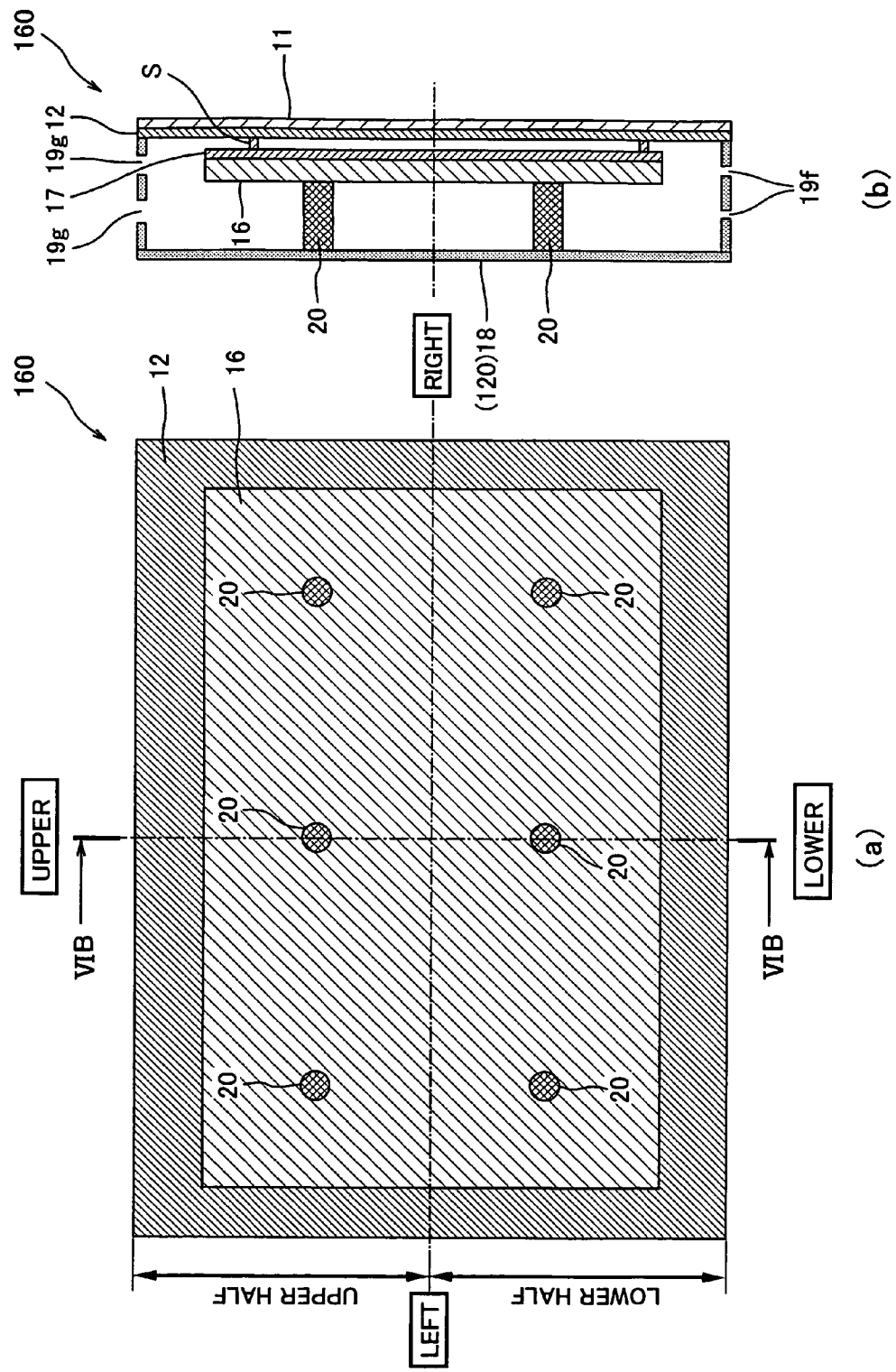
FIG. 12 is an illustration three-dimensionally modeling the conventional plasma display device for numerical calculation.

FIG. 12 is an illustration three-dimensionally modeling the conventional plasma display device of FIG. 11 for numerical calculation. This model is provided for comparison with the analytical model 130 shown in FIG. 9 as to result of analysis. Specifically, FIG. 12(a) is a rear elevational view showing the analytical model of the plasma display device as viewed from behind and FIG. 12(b) is a sectional view, taken along line VIB-VIB of FIG. 12(a), of the analytical model.

The structures of the respective analytical models 130 and 160 shown in FIGS. 9 and 12 are simplified as compared with the plasma display devices 100 and 150 shown in FIGS. 7 and 11 within such limits as not to influence numerical calculation.

For example, the analytical models 130 and 160 each excluding the leg portion 13, the front cover 15 and the protective panel 14 exerted no influence on the evaluation of numerical analysis. Also, the rod-shaped heat transfer members 20 used in each of the analytical models 130 and 160 are each modeled to join to the electronic component 16 simply. By thus reducing the number of elements corresponding to respective of unit analytical areas for numerical calculation as many as possible, the storage capacity of a computer used and the calculation time required are saved.

According to FIG. 9, the substantially rectangular PDP 11 is positioned so as to serve as a lid covering the opening of the substantially rectangular back cover 18 having the open front. The substantially rectangular chassis 12 fixing the PDP 11 is positioned in contact with the rear surface of the PDP 11.

The circuit board 17 is positioned on the rear of the chassis 12 via the spacer S and carries the electronic components 16 mounted thereon.

The configuration of the electronic components 16 in a plan view is modeled into a rectangular electronic component extending over the entire area of the circuit board 17 for the purpose of simplified modeling.

Here, when the back cover 18 is vertically equally divided into the upper half and the lower half, eight rod-shaped heat transfer members 20 which interconnect the rear of the back cover 18 and the electronic component 16 to allow heat transfer to occur therebetween are distributed only in the lower half of the back cover 18 in a one-sided fashion. The pattern of distribution of the rod-shaped heat transfer members 20 in the plane of the back cover 18 is the same as that of the rod-shaped heat transfer members 20b in the plasma display device 100 (FIG. 7).

Each of the rod-shaped heat transfer members 20 contacts the electronic component 16 at one end, extends from the contact position toward the back cover 18 in the thicknesswise direction of the plasma display device, and contacts the rear of the back cover 18 at the opposite end.

Here, the PDP 11 and the electronic component 16 as heat sources are each set to generate an amount of heat under the condition of 200 W. The thermal conductivities of the materials of respective components are inputted and the thermal resistance between adjacent components not taken into consideration.

Aluminum (thermal conductivity: 237 J/msK) is selected as the material for the rod-shaped heat transfer members 20 and the back cover 18.

As a flow condition of the fluid, natural air convection is assumed to occur throughout elements dividing the space defined by the analytical model, and the air temperature in an element corresponding to an external space of the analytical model is set to room temperature (20° C.).

An appropriate open area ratio corresponding to the openings 19g is inputted to an element corresponding to the upper end face of the back cover 18 and an appropriate open area ratio corresponding to the openings 19f is inputted to an element corresponding to the lower end face of the back cover 18. Thus, modeling is made so as to allow air ventilation to occur between the inside and the outside of the analytical model 130.

The analytical model 160 shown in FIG. 12 is the same as the analytical model 130 shown in FIG. 9 except the number of rod-shaped heat transfer members and the distribution of the rod-shaped heat transfer members in the plane of the back cover 18. For this reason, description of the features shared by the two is omitted.

According to FIG. 12, when the back cover 18 is vertically equally divided into the upper half and the lower half, three rod-shaped heat transfer members 20 which interconnect the lower half of the rear of the back cover 18 and the electronic component 16 to allow heat transfer to occur therebetween are arranged side by side horizontally of the analytical model and, likewise, three rod-shaped heat transfer members 20 which interconnect the upper half of the rear of the back cover 18 and the electronic component 16 to allow heat transfer to occur therebetween are arranged side by side horizontally of the analytical model 160. Thus, the rod-shaped heat transfer members 20 are evenly distributed throughout the upper and lower halves of the back cover 18.

Analytical Simulator

Numerical calculation of thermofluid in respect of the analytical models 130 and 160 shown in FIGS. 9 and 12 is performed using a multi-purpose thermofluid analysis program (thermofluid analysis software produced by Software Cradle Co., Ltd.; Trademark: STREAM).

A specific analytical technique used is a discretizing technique called "finite volume method". According to this technique, a region to be analyzed including the analytical model 130 or 160 is discretized into fine spaces each comprised of a hexahedron element (the number of elements: about 30,000). Conventional expressions of relation, which rule heat transfer and flow of fluid on the basis of balance of heat and fluid given and received among these very fine elements, are solved and computation is repeatedly performed until the resulting solutions reach convergence.

The above-mentioned expressions of relation include an equation of motion (Navier-Stokes equation), an equation of energy, and an expression of conservation of an amount of turbulence based on a turbulence model. Detailed description of such expressions will be omitted herein.

Analysis Result

Figure 10:
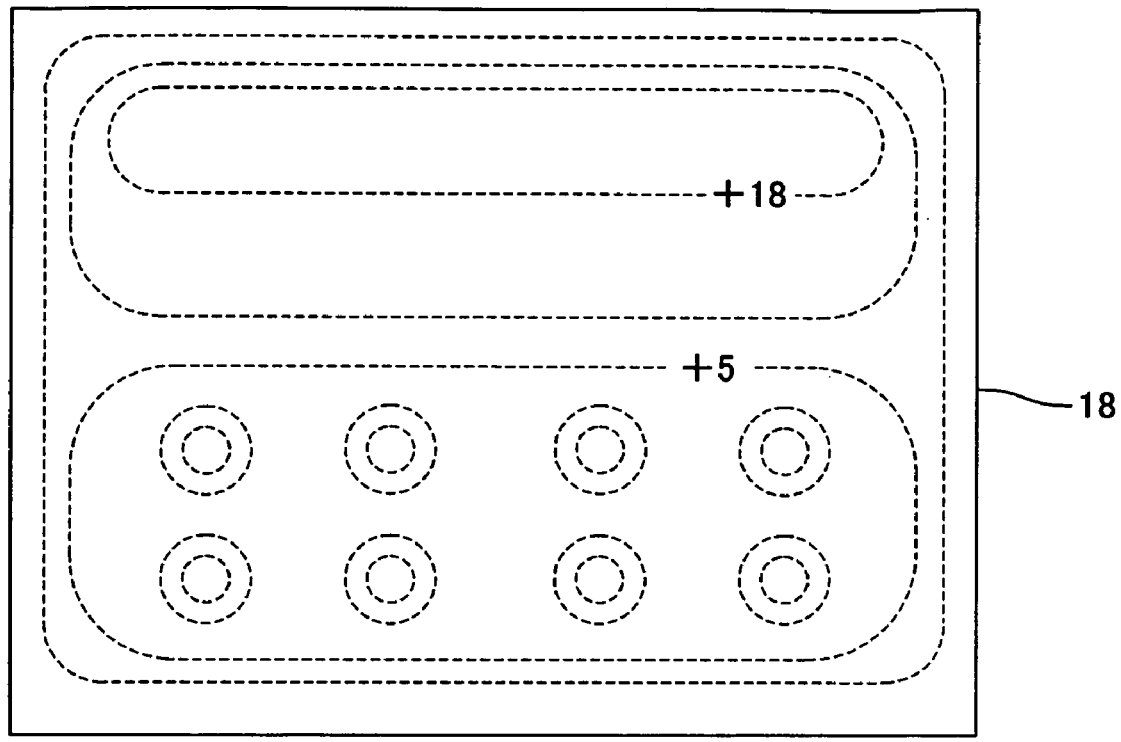
FIG. 10 is a diagram showing surface temperature contour lines of a back cover obtained based on physical quantity calculation data on each element of the analytical model shown in FIG. 9.
Figure 13:
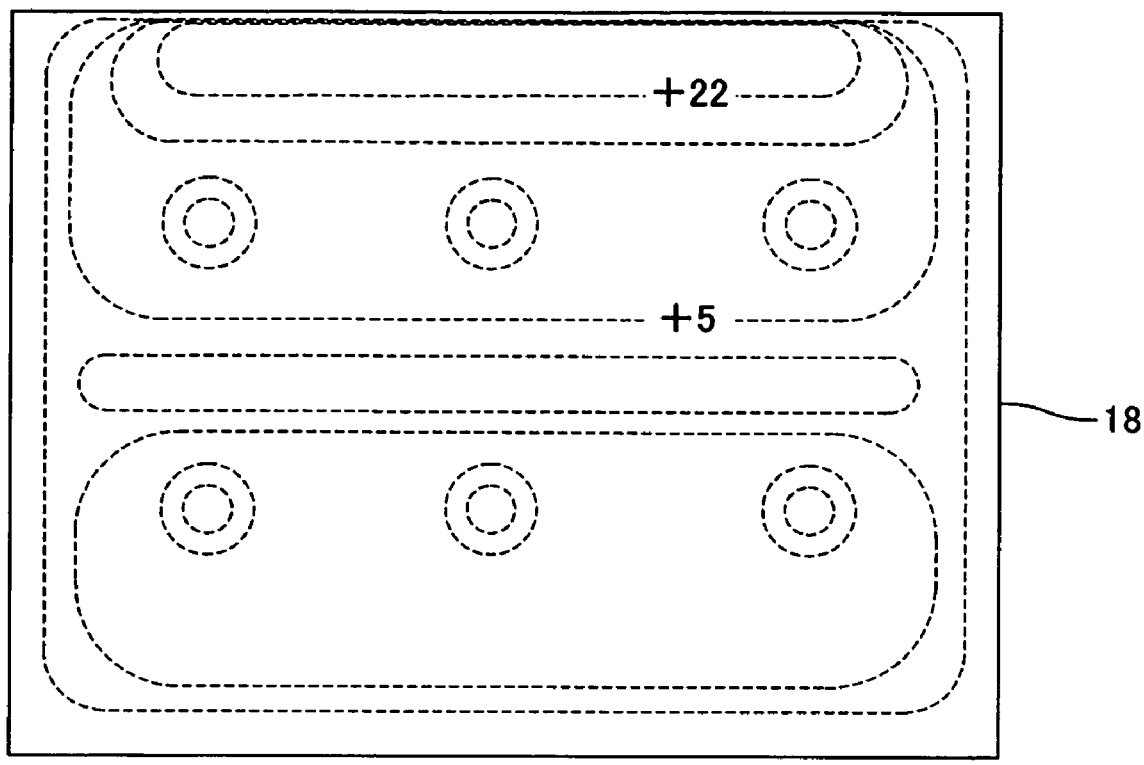
FIG. 13 is a diagram showing surface temperature contour lines of a back cover obtained based on physical quantity calculation data on each element of the analytical model shown in FIG. 12.

FIG. 10 is a diagram showing surface temperature contour lines of the back cover (indicating temperature difference from room temperature (20° C.)) obtained based on temperature data on each of the elements of the analytical model shown in FIG. 9; and FIG. 13 is a diagram showing surface temperature contour lines of the back cover (indicating temperature difference from room temperature (20° C.)) obtained based on temperature data on each of the elements of the analytical model shown in FIG. 12.

Figure 14:
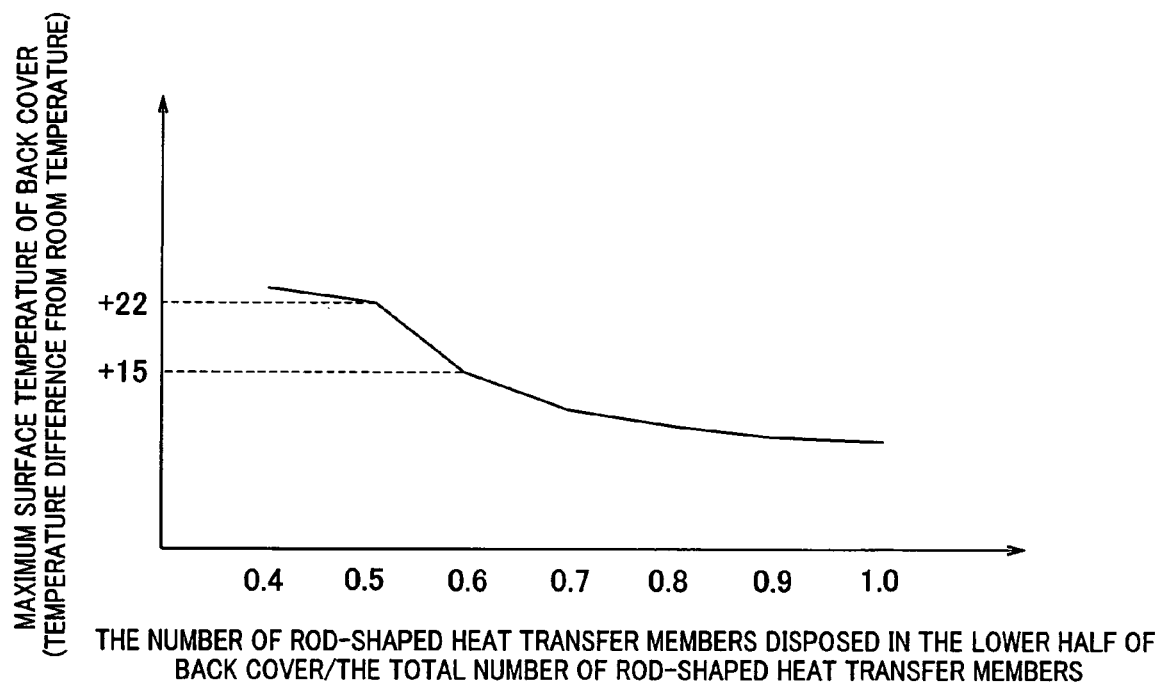
FIG. 14 is a diagram showing an analysis result obtained by appropriately modifying the construction of the analytical model shown in FIG. 9.

FIG. 14 is a diagram showing one exemplary analysis result obtained by appropriately changing the distribution of the rod-shaped heat transfer members in the analytical model shown in FIG. 9. In FIG. 14, the abscissa represents a value obtained by dividing the number of those rod-shaped heat transfer members 20 disposed in the lower half of the back cover by the total number of the rod-shaped heat transfer members 20 and the ordinate represents the maximum surface temperature of the back cover (in terms of temperature difference from room temperature (20° C.)).

As can be understood from the comparison between the results shown in respective of FIGS. 10 and 13, when the back cover 18 is vertically equally divided into the upper half and the lower half, the uneven distribution of the rod-shaped heat transfer members 20 in which the eight rod-shaped heat transfer members 20 are disposed only in the lower half of the back cover 18 in a one-sided fashion as shown in FIG. 9 (FIG. 10) lowered the maximum surface temperature of the back cover 18 as compared with the even distribution of the rod-shaped heat transfer members 20 in which the rod-shaped heat transfer members 20 are evenly distributed throughout the upper and lower halves of the back cover 18 as shown in FIG. 12 (FIG. 13). Specifically, the maximum temperature of the surface temperature contour lines of the back cover 18 of the analytical model 130 (FIG. 9) was higher than room temperature (20° C.) by 18° C., while the maximum temperature of the surface temperature contour lines of the back cover 18 of the analytical model 160 (FIG. 12) was higher than room temperature (20° C.) by 22° C.

It is proved from the above-described analysis results that the effect of uniformalizing the heat distribution in the plane of the back cover 18 is achieved by an uneven distribution of the rod-shaped heat transfer members 20 in which the rod-shaped heat transfer members 20 are overconcentrated in the lower half of the vertically equally divided back cover 18 in such a manner that the sum total of minimum cross-sectional areas of those rod-shaped heat transfer members 20 which are disposed in the lower half of the back cover 18 is made larger than the sum total of minimum cross-sectional areas of those rod-shaped heat transfer members 20 which are disposed in the upper half of the back cover 18, the cross-sectional areas being the areas of cross-sections of the rod-shaped heat transfer members 20 cut perpendicularly to the heat transfer direction toward the back cover 18.

Also, as can be estimated from FIG. 14, the maximum surface temperature of the back cover 18 (in terms of a temperature difference from room temperature) can be adjusted to not more than 15° C. when (the number of rod-shaped heat transfer members 20 disposed in the lower half of the back cover 18/the total number of rod-shaped heat transfer members 20)≧0.6. Thus, the surface temperature distribution over the back cover 18 can be suitably uniformalized advantageously. Stated otherwise, from the viewpoint of a uniform surface temperature distribution over the back cover 18, an uneven distribution of the rod-shaped heat transfer members 20 is considered to be desirable wherein a larger number of rod-shaped heat transfer members 20 are distributed in the lower half of the back cover 18 than in the upper half of the back cover 18 by adjusting a numerical value obtainable from dividing the number of those rod-shaped heat transfer members 20 which are disposed in the lower half of the back cover 18 (equivalent to the sum total of minimum cross-sectional areas of those rod-shaped heat transfer members 20 which are disposed in the lower half of the back cover 18) by the number of those rod-shaped heat transfer members 20 which are disposed in the upper half of the back cover 18 (equivalent to the sum total of minimum cross-sectional areas of those rod-shaped heat transfer members 20 which are disposed in the upper half of the back cover 18) to not less than 1.5.

Variations of the Third Embodiment

Description will be made of variations 1 to 5 of the present embodiment. These variations can achieve the effect of uniformalizing the heat distribution uniform in the plane of the back cover 18 to the same extent as in the present embodiment.

(Variation 1)

Figure 15:
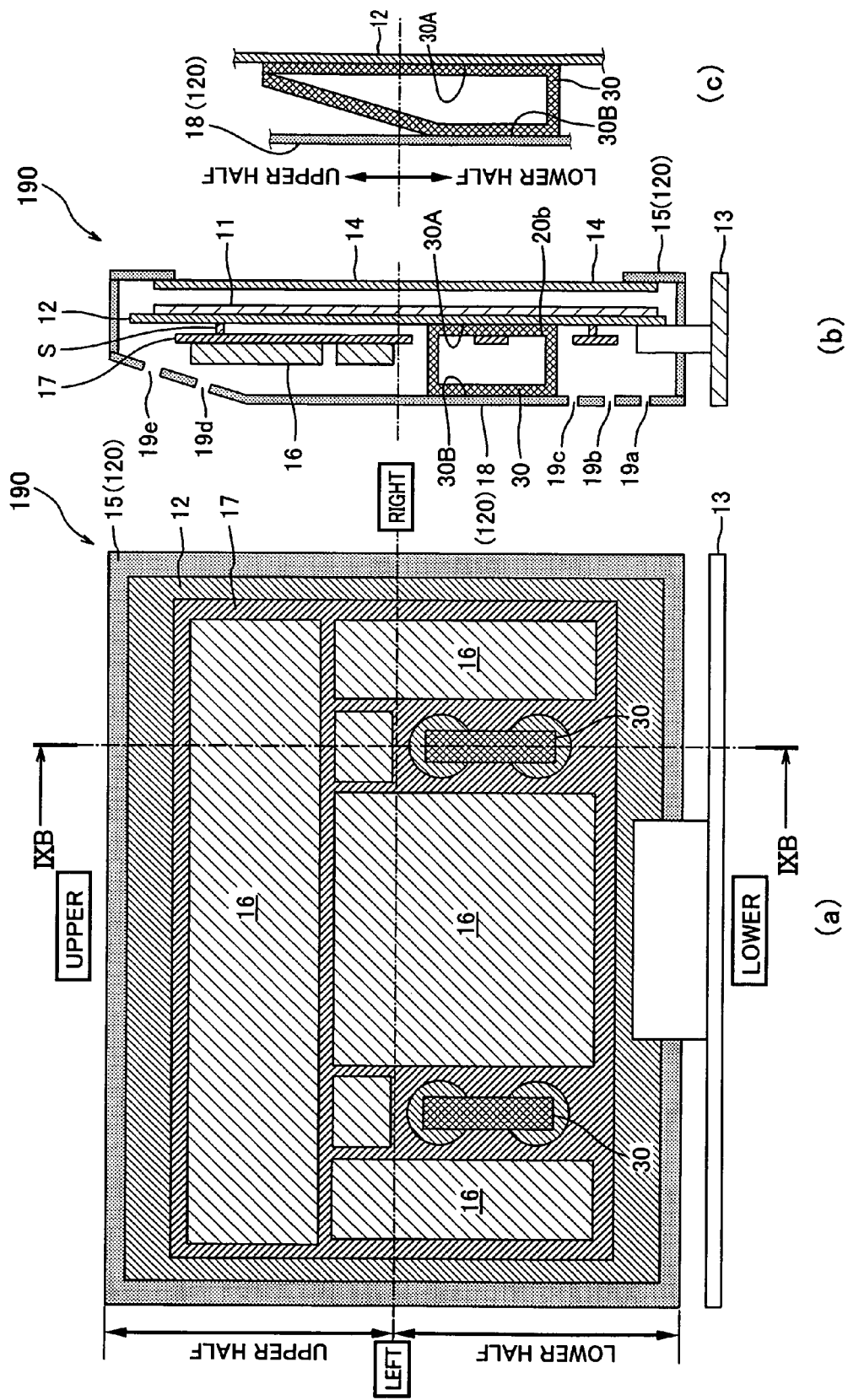
FIG. 15 is an illustration showing the construction of a plasma display device according to a variation 1 of the third embodiment.

FIG. 15 is an illustration showing the construction of a plasma display device according to a variation 1 of the third embodiment. Specifically, FIG. 15(a) is a rear elevational view showing the plasma display device as viewed from behind and FIG. 15(b) is a sectional view, taken along line IXB-IXB of FIG. 15(a), of the plasma display device. Like reference characters are used to designate like or corresponding elements throughout FIG. 15 and the third embodiment (FIG. 7) for the purpose of omitting the description thereof.

The plasma display device 190 according to this variation includes two annular heat transfer members 30 (heat transfer means or annular members) instead of the cylindrical rod-shaped heat transfer members 20a shown in FIG. 7, each of the annular heat transfer members 30 being formed like a ring by joining rod materials having a substantially square section with each other.

As can be seen from FIG. 15, at appropriate right- and left-hand locations of the plasma display device 190, first portions 30A of the respective annular heat transfer members 30 are brought into contact with the PDP 11 (exactly speaking, via the chassis 12) and second portions 30B of the respective annular heat transfer members 30 are brought into contact with the rear of the lower half of the vertically equally divided back cover 18. Accordingly, the remaining portion of each annular heat transfer member 30 other than the first and second portions 30A and 30B is positioned to allow heat transfer to occur between the PDP 11 and the lower half of the back cover 18.

Contact between the second portion 30B of each annular heat transfer member 30 and the rear of the lower half of the back cover 18 is critical to uniformalizing the heat distribution in the plane of the back cover 18. On the other hand, it is desirable for the first portion 30A of each annular heat transfer member 30 to extend as long as possible vertically along the PDP 11 across the center line dividing the back cover 18 into the upper and lower halves. Such a feature allows a larger amount of heat generated from the PDP 11 to be transferred to the lower half of the back cover 18.

(Variation 2)

Figure 16:
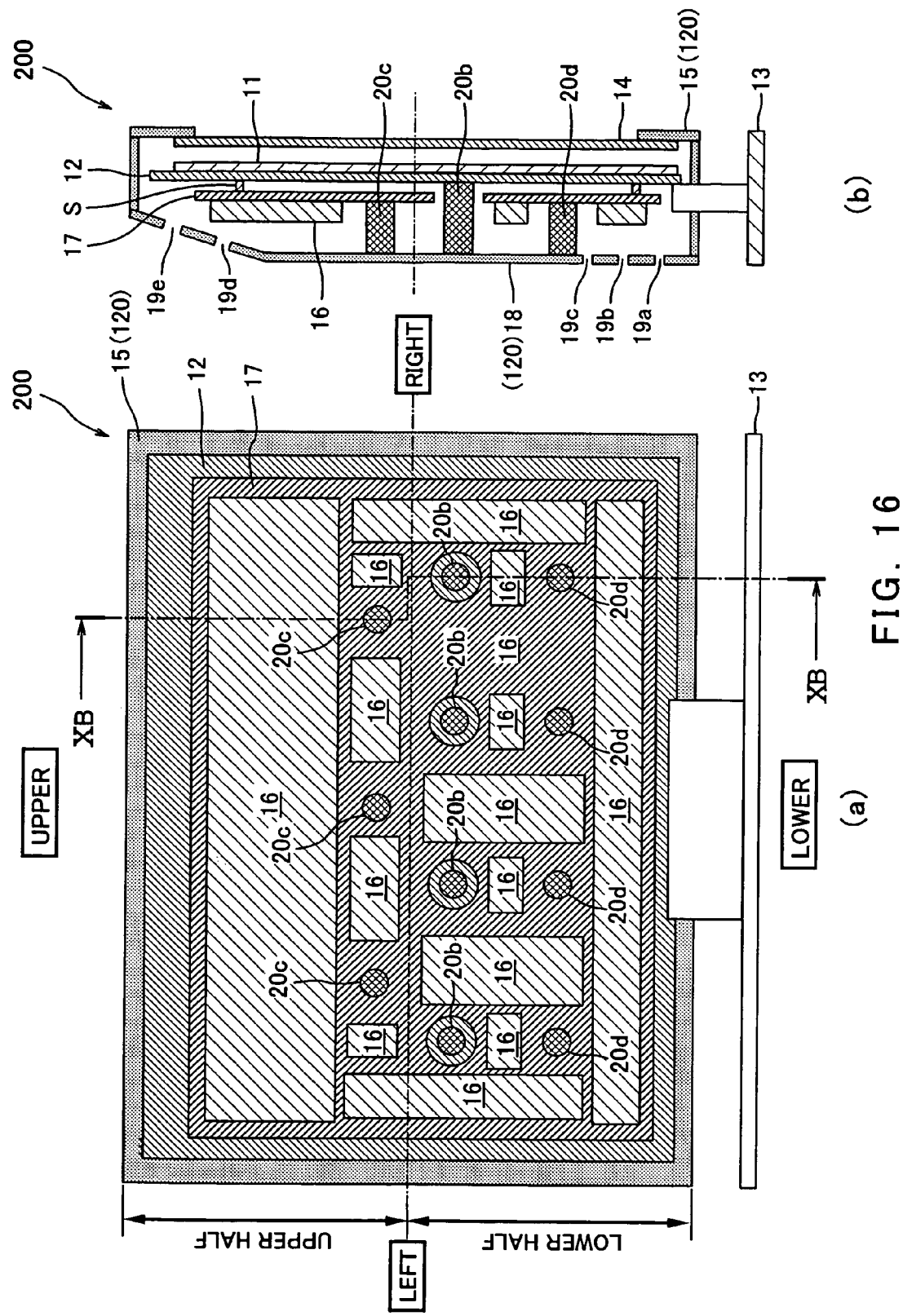
FIG. 16 is an illustration showing the construction of a plasma display device according to a variation 2 of the third embodiment.

FIG. 16 is an illustration showing the construction of a plasma display device according to a variation 2 of the third embodiment. Specifically, FIG. 16(a) is a rear elevational view showing the plasma display device as viewed from behind and FIG. 16(b) is a sectional view, taken along line XB-XB of FIG. 16(a), of the plasma display device. Like reference characters are used to designate like or corresponding elements throughout FIG. 16 and the third embodiment (FIG. 7) for the purpose of omitting the description thereof.

In the plasma display device 200 according to this variation, rod-shaped heat transfer members 20c which interconnect the back cover 18 and the circuit board 17 carrying the electronic components 16 mounted thereon to allow heat transfer to occur therebetween are provided in the upper half of the back cover 18 instead of the rod-shaped heat transfer members 20*a* shown in FIG. 7 which interconnect the back cover 18 and the PDP 11 to allow heat transfer to occur therebetween, while rod-shaped heat transfer members 20*d* which interconnect the back cover 18 and the circuit board 17 carrying the electronic components 16 mounted thereon to allow heat transfer to occur therebetween are provided in the lower half of the back cover 18 instead of a part of the rod-shaped heat transfer members 20*b* shown in FIG. 7 which interconnect the back cover 18 and the PDP 11 to allow heat transfer to occur therebetween.

As can be seen from FIG. 16, in the upper half of the vertically equally divided back cover 18, three rod-shaped heat transfer members 20*c* which interconnect the back cover 18 and the circuit board 17 carrying the electronic components 16 mounted thereon to allow heat transfer to occur therebetween are arranged side by side horizontally of the plasma display device 200; and in the lower half of the back cover 18, four rod-shaped heat transfer members 20*d* (in a first row) which interconnect the back cover 18 and the circuit board 17 carrying the electronic components 16 mounted thereon to allow heat transfer to occur therebetween are arranged side by side horizontally of the plasma display device 200, and four rod-shaped heat transfer members 20*b* (in a second row) which interconnect the back cover 18 and the PDP 11 through through-holes of the circuit board 17 to allow heat transfer to occur therebetween are arranged side by side horizontally of the plasma display device 200.

This arrangement is capable of achieving the effect of uniformalizing the heat distribution in the plane of the back cover 18. In addition, when heat generated from both of the PDP 11 and the circuit board 17 (particularly the electronic components 16) is allowed to dissipate to the back cover 18, the arrangement can avoid direct contact of the PDP 11 with the circuit board 17 via any heat transfer member to cut off heat transfer between the PDP 11 and the circuit board 17 suitably, thereby preventing the PDP 11 from being thermally damaged by heat from the circuit board 17.

(Variation 3)

Figure 17:
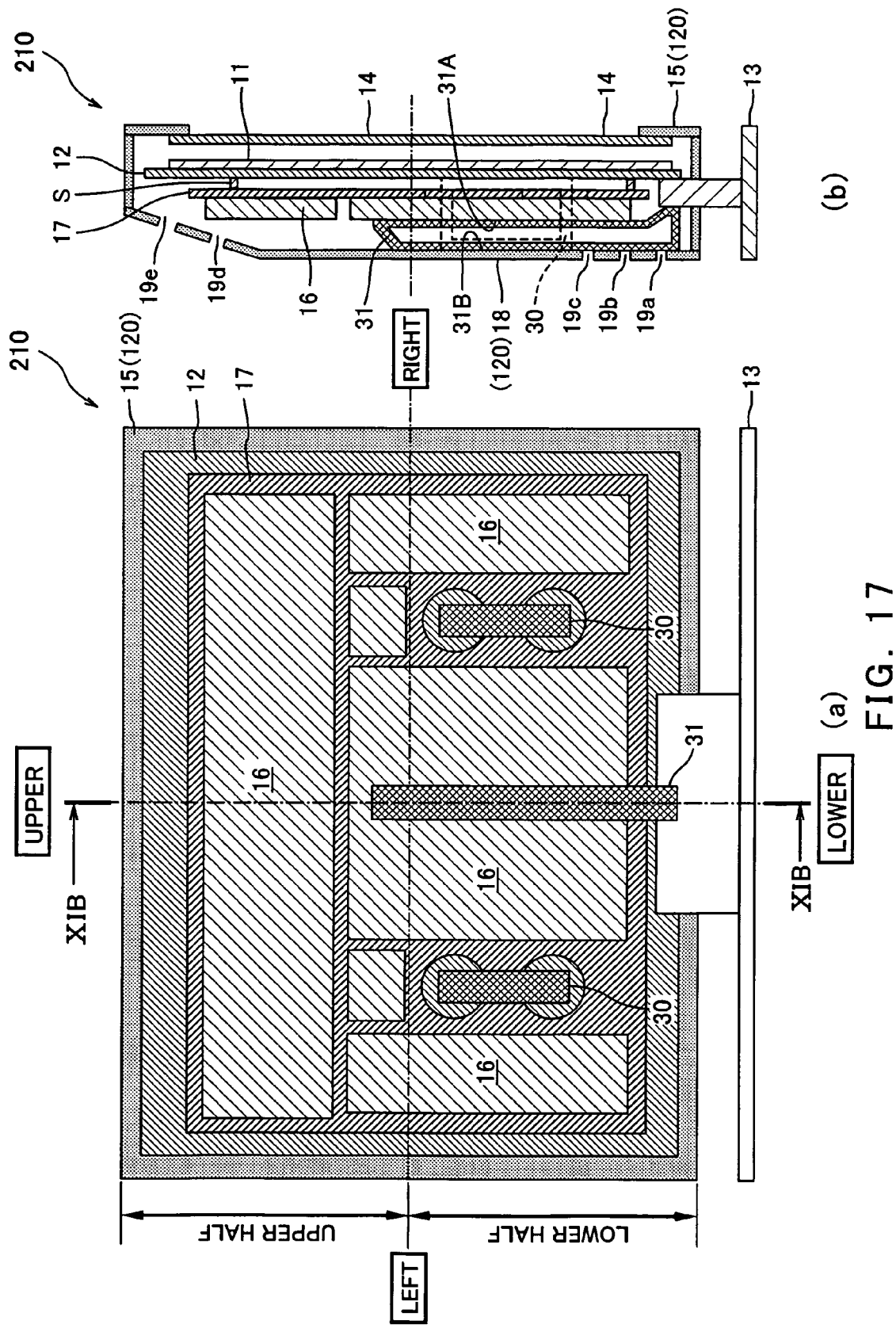
FIG. 17 is an illustration showing the construction of a plasma display device according to a variation 3 of the third embodiment.

FIG. 17 is an illustration showing the construction of a plasma display device according to a variation 3 of the third embodiment. Specifically, FIG. 17(*a*) is a rear elevational view showing the plasma display device as viewed from behind and FIG. 17(*b*) is a sectional view, taken along line XIB-XIB of FIG. 17(*a*), of the plasma display device. Like reference characters are used to designate like or corresponding elements throughout FIG. 17 and the third embodiment (FIG. 7) for the purpose of omitting the description thereof.

The plasma display device 210 according to this variation includes plural annular heat transfer members 30 and 31 (heat transfer means or annular members) instead of the cylindrical rod-shaped heat transfer members 20*a* and 20*b* shown in FIG. 7, each of the annular heat transfer members 30 and 31 being formed like a ring by joining rod materials having a substantially square section with each other. Since the structure of each annular heat transfer member 30 is the same as in the variation 1, detailed description thereof will be omitted.

As can be seen from FIG. 17, in a substantially central portion of the plasma display device 210, a first portion 31A of the annular heat transfer member 31 is brought into contact with the electronic components (exactly speaking, a radiator fin or the like provided for the electronic components 16) and a second portion 31B of the annular heat transfer member 31 are brought into contact with the rear of the lower half of the vertically equally divided back cover 18. Accordingly, the remaining portion of the annular heat transfer member 31 other than the first and second portions 31A and 31B is positioned to allow heat transfer to occur between the electronic components 16 and the lower half of the back cover 18.

Like the plasma display device 200 according to the variation 2, the above-described arrangement is capable of achieving the effect of uniformalizing the heat distribution in the plane of the back cover 18. In addition, the arrangement is capable of cutting off direct heat transfer between the PDP 11 and the electronic components 16 through any heat transfer member while allowing heat generated from both of the PDP 11 and the electronic components 16 to dissipate to the back cover 18, thereby preventing the PDP 11 from being thermally damaged by heat from the circuit board 17.

(Variation 4)

Figure 18:
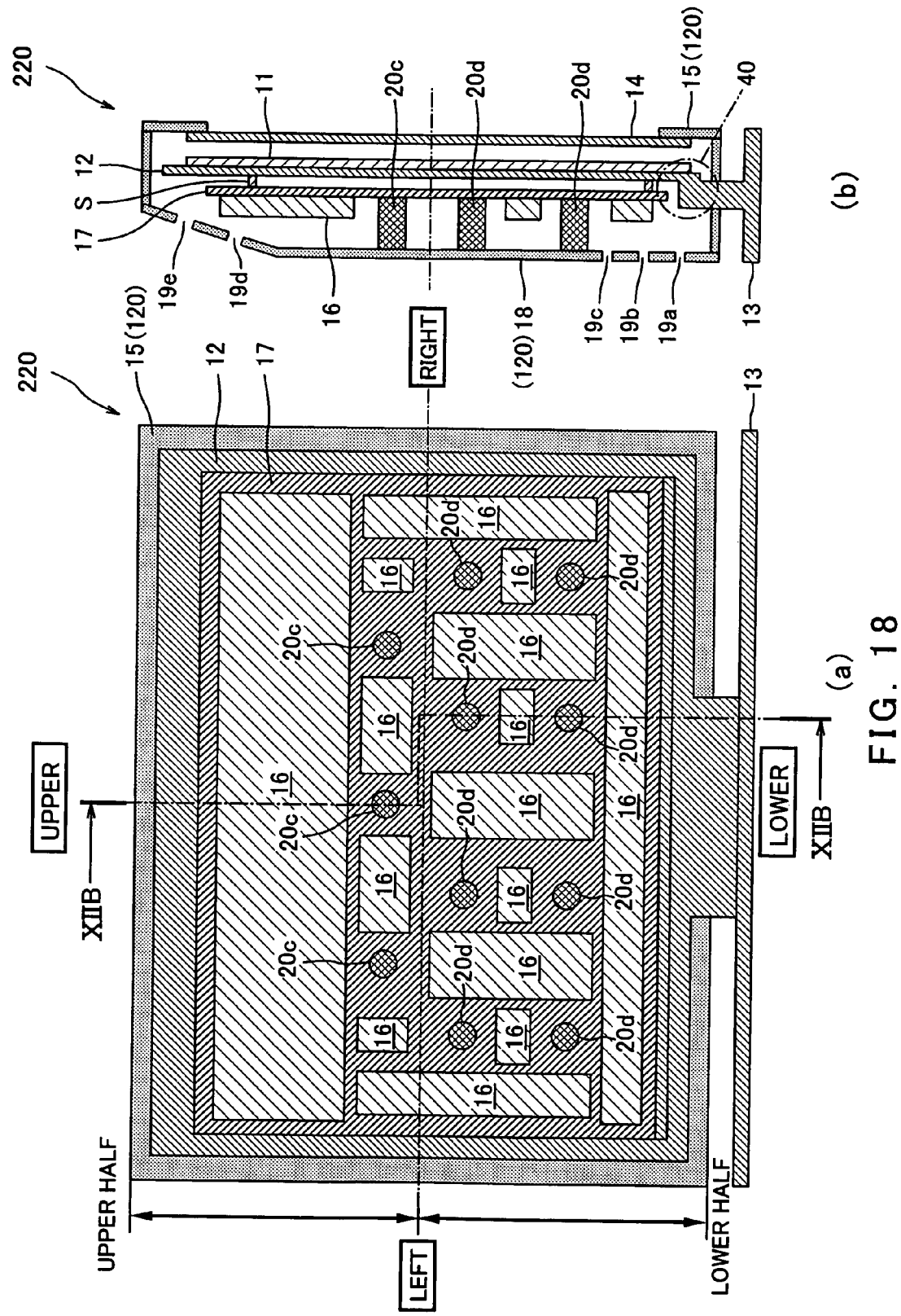
FIG. 18 is an illustration showing the construction of a plasma display device according to a variation 4 of the third embodiment.

FIG. 18 is an illustration showing the construction of a plasma display device according to a variation 4 of the third embodiment. Specifically, FIG. 18(*a*) is a rear elevational view showing the plasma display device as viewed from behind and FIG. 18(*b*) is a sectional view, taken along line XIIB-XIIB of FIG. 18(*a*), of the plasma display device. Like reference characters are used to designate like or corresponding elements throughout FIG. 18 and the third embodiment (FIG. 7) for the purpose of omitting the description thereof.

In the plasma display device 220 shown in FIG. 18 according to this variation, three rod-shaped heat transfer members 20*c* which interconnect the back cover 18 and the circuit board 17 carrying the electronic components 16 mounted thereon to allow heat transfer to occur therebetween are provided in the upper half of the back cover 18 instead of the rod-shaped heat transfer members 20*a* shown in FIG. 7 which interconnect the back cover 18 and the PDP 11 to allow heat transfer to occur therebetween, while eight rod-shaped heat transfer members 20*d* which interconnect the back cover 18 and the circuit board 17 carrying the electronic components 16 mounted thereon to allow heat transfer to occur therebetween are provided in the lower half of the back cover 18 instead of the rod-shaped heat transfer members 20*b* shown in FIG. 7 which interconnect the back cover 18 and the PDP 11 to allow heat transfer to occur therebetween. The pattern of distribution of the rod-shaped heat transfer members 20*c* and 20*d* in the plane of the back cover 18 is the same as in the third embodiment (FIG. 7).

The plasma display device 220 according to this variation further includes a heat transfer member 40 (heat transfer means) which is formed integral with the leg portion 13 so as to form part of the leg portion 13 to allow heat transfer to occur between the chassis 12 on the rear of the PDP 11 and the leg portion 13 which holds the PDP 11 via the chassis 12 while serving as a support for the plasma display device 220, as shown in FIG. 18(*b*).

As described in relation to the third embodiment, examples of desirable materials for the heat transfer member 40 and the leg portion 13 include aluminum (thermal conductivity: 237 J/msK), iron (80.4 J/msK), copper (401 J/msK), magnesium (156 J/msK), silver (429 J/msK), graphite (parallel with layers)(1960 J/msK), and diamond (1360 to 2320 J/msK).

This arrangement allows heat generated from the PDP 11 to be transferred to the back cover 18 through the leg portion 13 (heat transfer member 40) rapidly, thereby achieving the effect of uniformalizing the heat distribution in the plane of the back cover 18 more suitably.

Further, like the plasma display device 200 according to the variation 2, the plasma display device 220 according to the present variation is capable of cutting off direct heat transfer between the PDP 11 and the circuit board 17 through any heat transfer member while allowing heat generated from both of the PDP 11 and the circuit board 17 (particularly the electronic components 16) to dissipate to the back cover 18, thereby preventing the PDP 11 from being thermally damaged by heat from the circuit board 17.

(Variation 5)

Figure 19:
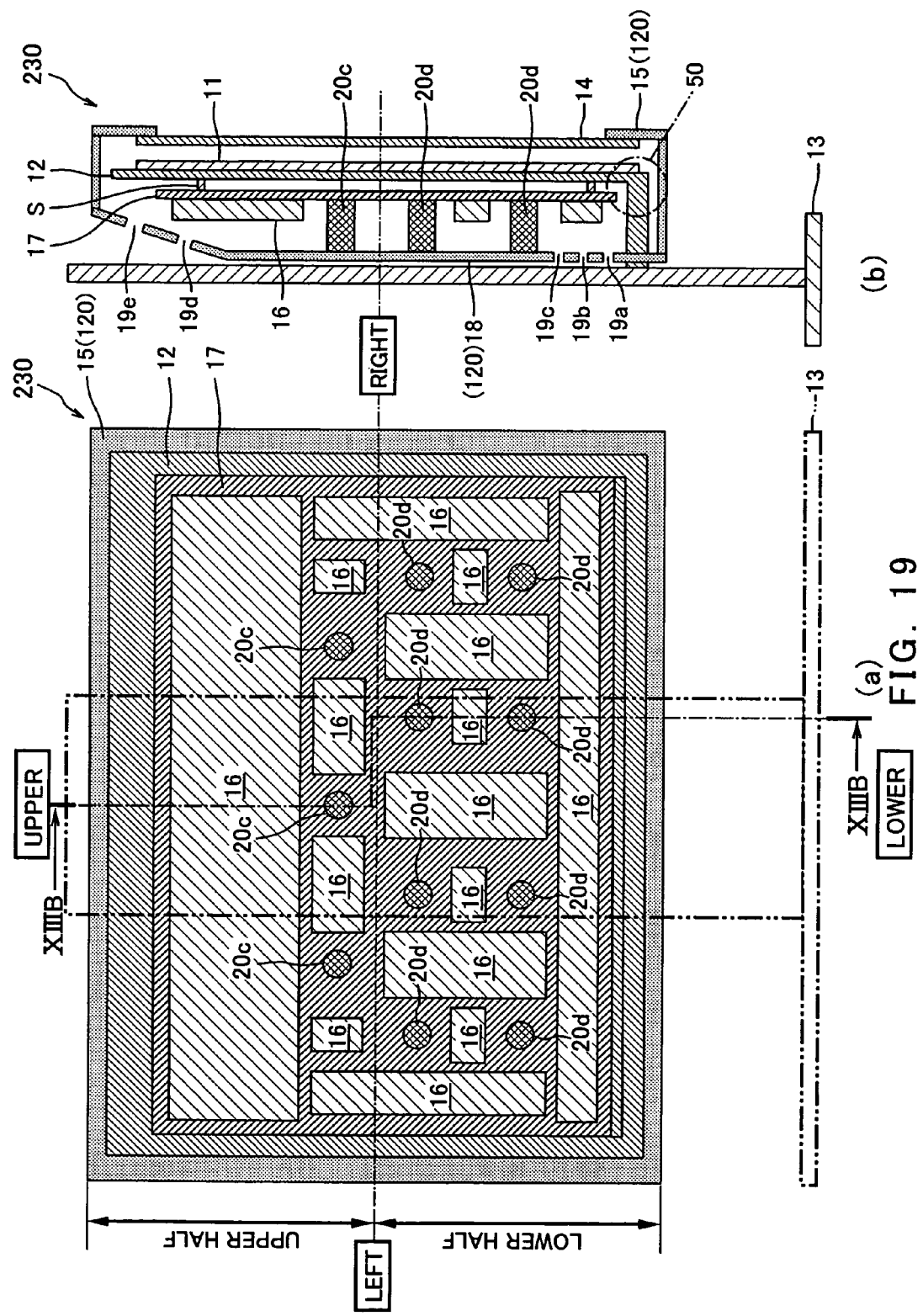
FIG. 19 is an illustration showing the construction of a plasma display device according to a variation 5 of the third embodiment.

FIG. 19 is an illustration showing the construction of a plasma display device according to a variation 5 of the third embodiment. Specifically, FIG. 19(*a*) is a rear elevational view showing the plasma display device as viewed from behind and FIG. 19(*b*) is a sectional view, taken along line XIIIB-XIIIB of FIG. 19(*a*), of the plasma display device. Like reference characters are used to designate like or corresponding elements throughout FIG. 19 and the third embodiment (FIG. 7) for the purpose of omitting the description thereof.

In the plasma display device 230 shown in FIG. 19 according to this variation, three rod-shaped heat transfer members 20*c* which interconnect the back cover 18 and the circuit board 17 carrying the electronic components 16 mounted thereon to allow heat transfer to occur therebetween are provided in the upper half of the back cover 18 instead of the rod-shaped heat transfer members 20*a* shown in FIG. 7 which interconnect the back cover 18 and the PDP 11 to allow heat transfer to occur therebetween, while eight rod-shaped heat transfer members 20*d* which interconnect the back cover 18 and the circuit board 17 carrying the electronic components 16 mounted thereon to allow heat transfer to occur therebetween are provided in the lower half of the back cover 18 instead of the rod-shaped heat transfer members 20*b* shown in FIG. 7 which interconnect the back cover 18 and the PDP 11 to allow heat transfer to occur therebetween. The pattern of distribution of the rod-shaped heat transfer members 20*c* and 20*d* in the plane of the back cover 18 is the same as in the third embodiment (FIG. 7).

The plasma display device 230 according to this variation further includes a rod-shaped heat transfer member 50 (heat transfer means) which is formed integral with the chassis 12 on the rear of the PDP 11 and extends to interconnect a lower edge portion of the chassis 12 and the leg portion 13 which holds the PDP 11 via the chassis 12 while serving as a support for the plasma display device 230, as shown in FIG. 19(*b*). This heat transfer member 50 is joined to the back cover 18 by appropriate fastening means to allow heat transfer to the back cover 18 to occur.

As described in relation to the third embodiment, examples of desirable materials for the heat transfer member 50 and the leg portion 13 include aluminum (thermal conductivity: 237 J/msK), iron (80.4 J/msK), copper (401 J/msK), magnesium (156 J/msK), silver (429 J/msK), graphite (parallel with layers)(1960 J/msK), and diamond (1360 to 2320 J/msK).

This arrangement allows heat generated from the PDP 11 to be transferred to the heat transfer member 50, the leg portion 13 and the back cover 18 rapidly, thereby achieving the effect of uniformalizing the heat distribution in the plane of the back cover 18 more suitably.

Further, like the variation 2, the plasma display device 230 according to the present variation is capable of cutting off direct heat transfer between the PDP 11 and the circuit board 17 through any heat transfer member while allowing heat generated from both of the PDP 11 and the circuit board 17 (particularly the electronic components 16) to dissipate to the back cover 18, thereby preventing the PDP 11 from being thermally damaged by heat from the circuit board 17.

As in the case of the first embodiment and the second embodiment, while the technique of uniformalizing the heat distribution over the casing of a plasma display device exemplified as a representative of display devices of the type using a flat display panel has been described above, the technique described herein is applicable not only to the plasma display device but also to any flat panel display device which has a rectangular flat casing and a heat-generating member disposed in the internal space of the casing. For example, this technique is considered to be effective for liquid crystal display devices because these devices generally have a rod-shaped backlight source as a heat-generating member. This technique is also applicable to liquid crystal display devices; FED (Field Emission Display) devices and organic EL display devices because a backlight for use in liquid crystal display devices, a FED and an organic EL panel generate heat.

Fourth Embodiment

Hereinafter, the fourth embodiment of the present invention will be described with reference to the drawings.

A plasma display device according to this embodiment is capable of achieving both the effect of uniformalizing the surface temperature distribution over the casing by the installation of a graphite sheet on the casing according to the second embodiment and the effect of uniformalizing the surface temperature distribution uniform over the casing by the overconcentrated distribution of heat transfer members in the lower half of the casing according to the third embodiment.

For convenience of description, an example described herein is a modification of the plasma display device shown in FIG. 3 or 5 (second embodiment) made by incorporating therein the design for a uniform heat distribution by the overconcentrated distribution of heat transfer members in the lower half of the casing (third embodiment).

If each of the plasma display devices (shown in FIGS. 7 and 15 to 19) according to the third embodiment (and its variations) is modified to incorporate therein the design for a uniform heat distribution by the installation of the graphite sheet on the casing, the same effect can be obtained. Since the construction of such a plasma display device can be understood easily from the following description, description thereof will be omitted herein.

Figure 20:
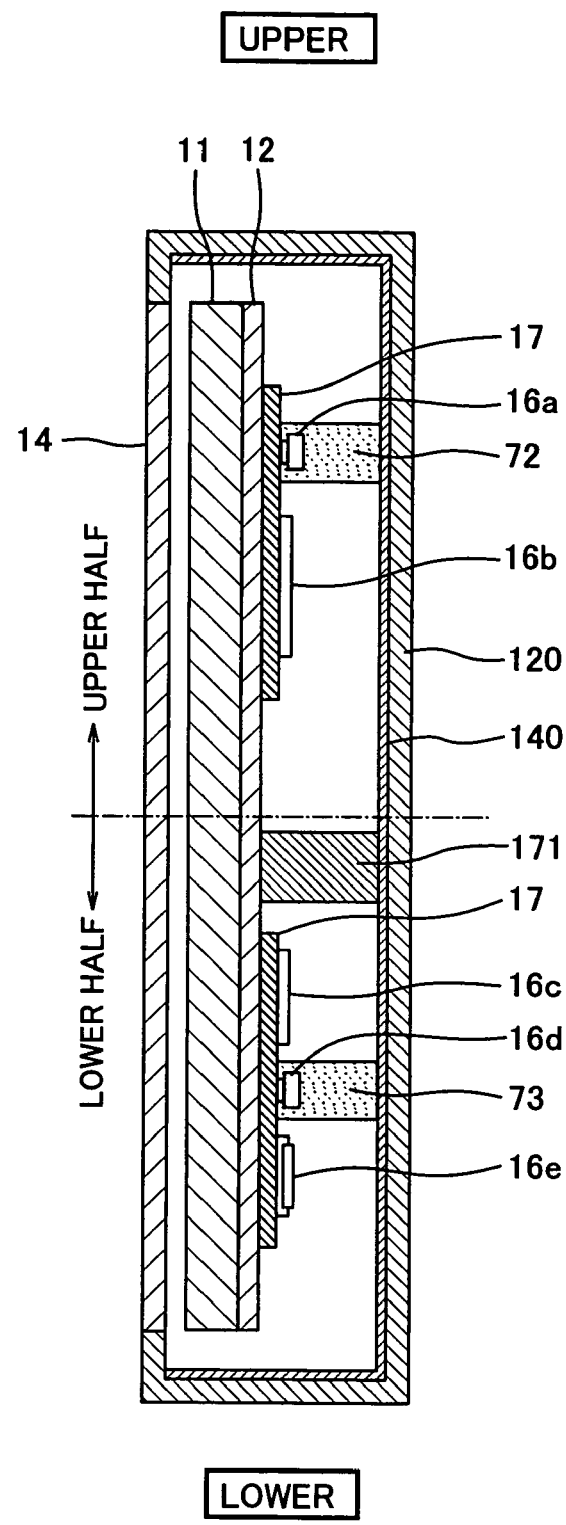
FIG. 20 is a sectional view showing one exemplary construction of a plasma display device according to a fourth embodiment.

FIG. 20 is a sectional view showing one exemplary construction of the plasma display device according to the fourth embodiment. More specifically, FIG. 20 is a sectional view showing the plasma display device constructed by incorporating the feature of the overconcentrated distribution of heat transfer members in the lower half of the casing according to the third embodiment into the plasma display device shown in FIG. 3.

Figure 21:
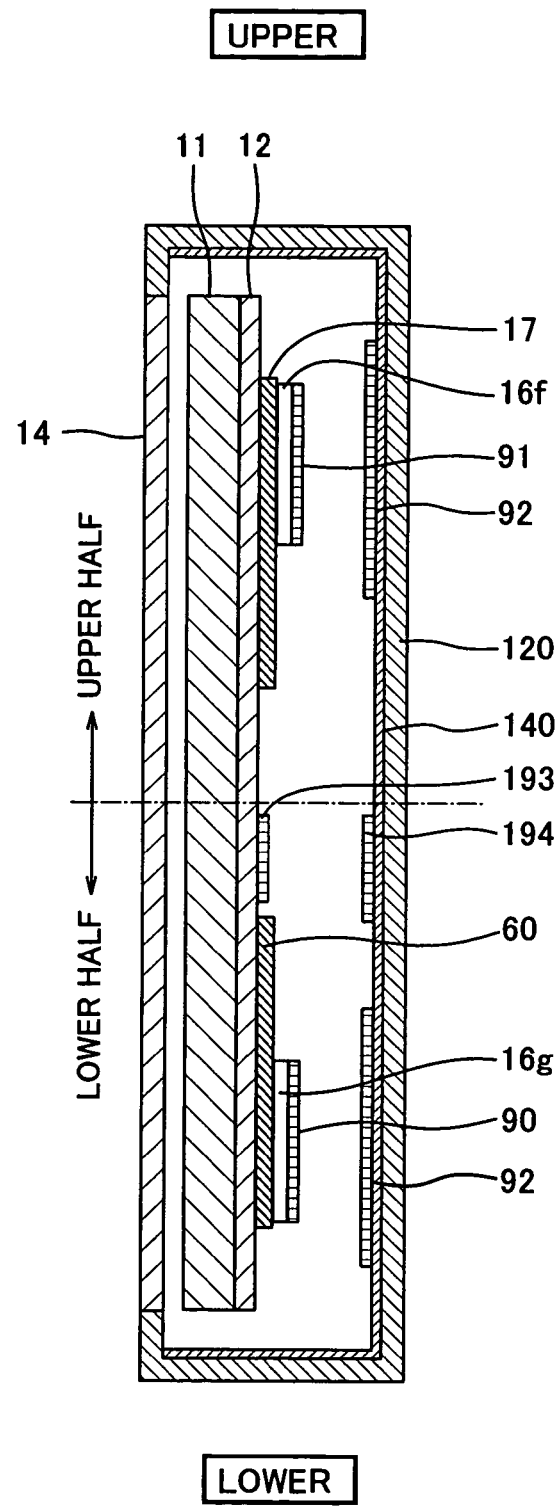
FIG. 21 is a sectional view showing another exemplary construction of the plasma display device according to the fourth embodiment.

FIG. 21 is a sectional view showing another exemplary construction of the plasma display device according to the fourth embodiment. More specifically, FIG. 21 is a sectional view showing the plasma display device constructed by incorporating the feature of the overconcentrated distribution of heat transfer members in the lower half of the casing according to the third embodiment into the plasma display device shown in FIG. 5.

Like reference characters are used to designate like or corresponding elements throughout FIG. 20 (or FIG. 21) and FIG. 3 (or FIG. 5) for the purpose of omitting or saving the description thereof.

According to FIG. 20, when the casing 120 is vertically equally divided into the upper and lower halves, aluminum heat transfer members 171 (heat transfer means) interconnecting the chassis 12 and the graphite sheet 140 are disposed in the lower half region of the casing 120.

According to FIG. 21, when the casing 120 is vertically equally divided into the upper and lower halves, a ceramic sheet 193 (a radiator member as heat transfer means) is affixed to the chassis 120 so as to cover a region of the chassis 12 located in the lower half of the casing 120, while a ceramic sheet 194 (a radiator member as heat transfer means) is affixed to the graphite sheet 140 so as to cover a region of the surface of the graphite sheet 140 which is opposed to the ceramic sheet 193.

As described in detail in relation to the third embodiment, in uniformalizing the surface temperature distribution uniform over the casing by balancing heat dissipation by the heat transfer means with heat dissipation by convected air, a numerical value obtained by dividing the sum total of minimum cross-sectional areas of the heat transfer members 171 (of aluminum) and heat transfer members 73 (of silicone rubber) which are disposed in the lower half of the casing 120 of the plasma display device shown in FIG. 20 by the sum total of minimum cross-sectional areas of the heat transfer members 72 (of silicone rubber) which are disposed in the upper half of the casing 120 is desirably adjusted to not less than 1.5.

In the case of the plasma display device shown in FIG. 21, likewise, a numerical value obtained by dividing the sum total of the surface areas of the ceramic sheet 90 and ceramic sheet 193 disposed in the region located in the lower half of the casing 120 by the sum total of the surface areas of the ceramic sheets 91 disposed in the region located in the upper half of the casing 120 is desirably adjusted to not less than 1.5.

In the plasma display device according to the present embodiment, the graphite sheet 140 affixed to the internal surface of the casing 120 has a thermal conductivity of 300 W/m·K in the plane thereof and a thermal conductivity of 20 W/m·K in the thickness wise direction thereof. This feature allows heat generated from the PDP 11 and from the electronic components 16*a*, 16*d*, 16*f* and 16*g* to be transferred to the graphite sheet 140 through the aforementioned heat transfer members (heat transfer means), subsequently diffused in the plane of the graphite sheet 140 and then transferred to the entire region of the casing 120, thus inhibiting a localized elevation in the temperature of the casing 120. Particularly, in the case of the conventional design concept that heat generated from the PDP 11 and from the electronic components 16*a*, 16*d*, 16*f* and 16*g* is intentionally concentrated on the aforementioned heat transfer members having an excellent thermal conductivity so as to be efficiently and rapidly dissipated toward the casing 120, a automatic demerit arises such that portions of the casing 120 located adjacent the heat transfer members are easily heated to elevated temperatures locally. The demerit can be advantageously improved by the use of the graphite sheet 140 according to the present embodiment.

At the same time, the surface temperature distribution over the casing 120 can be uniformalized because the degree of heating of the lower half of the casing 120 by heat generated from the heat-generating members (including the PDP and the electronic components) and then transferred to the casing 120 through the heat transfer means is well balanced with the degree of heating of the upper half of the casing 120 by heat of high-temperature convected air warmed by heat exchange with such heat-generating members by virtue of the distribution of the heat transfer members in the plane of the casing 120 wherein the sum total of the areas (minimum cross-sectional areas or surface areas) of those heat transfer members which are located in the lower half of the back cover 18 is made larger than the sum total of the areas (minimum cross-sectional areas or surface areas) of those heat transfer members which are located in the upper half of the back cover 18.

Thus, the plasma display device according to the present embodiment is designed for optimum heat dissipation so as to be capable of achieving both the effect of uniformalizing the surface temperature distribution over the casing by the installation of the graphite sheet on the casing and the effect of uniformalizing the surface temperature distribution over the casing by the overconcentrated distribution of heat transfer members in the lower half of the casing.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

INDUSTRIAL APPLICABILITY

The display device according to the present invention is capable of uniformalizing the heat distribution over the surface of a casing for flat-type display devices and is useful as a display device for thin-screen televisions for example.

The invention claimed is:

1. A display device comprising:
a display panel having surface arrays of plural pixels for displaying an image by light radiation control on a pixel to pixel basis;
an electronic component forming a control circuit configured to perform said light radiation control;
a casing comprising aluminum and housing said display panel and said electronic component therein;
a flat heat-conductive sheet interposed between said display panel and said casing and between said electronic component and said casing; and
wherein said heat-conductive sheet has a higher thermal conductivity in a plane thereof than in a thickness wise direction thereof.

2. The display device according to claim 1, wherein said heat-conductive sheet and at least one of said display panel and said electronic component are arranged to allow heat transfer to occur therebetween through first heat transfer means.

3. The display device according to claim 2, wherein the first heat transfer means are first heat transfer members interconnecting said heat-conductive sheet and at least one of said display panel and said electronic component.

4. The display device according to claim 2, wherein the first heat transfer means has a first radiator member joined to at least one of said display panel and said electronic component, and a second radiator member joined to said heat-conductive sheet, said first radiator member being configured to radiate heat, said second radiator member being configured to absorb the heat radiated from said first radiator member.

5. The display device according to claim 2, wherein when said casing is vertically equally divided into an upper half and a lower half, the sum total of minimum cross-sectional areas of the first heat transfer means which are disposed in the lower half of said casing is larger than the sum total of minimum cross-sectional areas of the first heat transfer means which are disposed in the upper half of said casing, the cross-sectional areas being the areas of cross sections of the first heat transfer means as viewed in the direction perpendicular to a heat transfer direction toward said casing.

6. The display device according to claim 5, wherein a numerical value obtained by dividing the sum total of minimum cross-sectional areas of the first heat transfer means which are disposed in the lower half of said casing by the sum total of minimum cross-sectional areas of the first heat transfer means which are disposed in the upper half of said casing is not less than 1.5.

7. The display device according to claim 5, wherein the first heat transfer means are rod members each having one end contacting at least one of said display panel and said electronic component and an opposite end contacting said heat-conductive sheet.

8. The display device according to claim 5, wherein the first heat transfer means are annular members each having a first portion contacting at least one of said display panel and said electronic component, a second portion contacting said heat-conductive sheet, and other portion than said first and second portions which is positioned to allow heat transfer to occur between said heat-conductive sheet and at least one of said display panel and said electronic component.

9. The display device according to claim 5, wherein said casing is provided with a first vent hole in the lower half thereof and a second vent hole in the upper half thereof.

10. The display device according to claim 9, wherein said first vent hole is an air intake hole for taking air into said casing, while said second vent hole is an air exhaust hole for exhausting air out of said casing.

11. The display device according to claim 5, further comprising a support member holding said display panel via a back member provided on a rear of said display panel, and third heat transfer means configured to allow heat transfer to occur between the back member and said support member, said third heat transfer means forming part of said support member.

12. The display device according to claim 5, further comprising a support member holding said display panel via a back member provided on a rear of said display panel, and fourth heat transfer means interconnecting the back member and said support member.

13. The display device according to claim 5, wherein said first heat transfer means have a thermal conductivity of not less than 80 J/msK.

14. The display device according to claim 5, wherein the first heat transfer means comprise a material containing any one selected from the group consisting of aluminum, iron, copper, magnesium, silver, graphite and diamond.

15. The display device according to claim 1, wherein a back member is provided on a rear of said display panel so as to extend along the plane of a rear surface of said display panel.

16. The display device according to claim 15, wherein said heat-conductive sheet and at least one of said back member and said electronic component are arranged to allow heat transfer to occur therebetween through second heat transfer means.

17. The display device according to claim 16, wherein the second heat transfer means are second heat transfer members interconnecting said back member and said heat-conductive sheet.

18. The display device according to claim 16, wherein the second heat transfer means has a third radiator member joined to said back member, and a fourth radiator member joined to said heat-conductive sheet, said third radiator member being configured to radiate heat, said fourth radiator member being configured to absorb the heat radiated from said third radiator member.

19. The display device according to claim 16, wherein when said casing is vertically equally divided into an upper half and a lower half, the sum total of minimum cross-sectional areas of the second heat transfer means which are disposed in the lower half of said casing is larger than the sum total of minimum cross-sectional areas of the second heat transfer means which are disposed in the upper half of said casing, the cross-sectional areas being the areas of cross sections of said second heat transfer means as viewed in the direction perpendicular to a heat transfer direction toward said casing.

20. The display device according to claim 19, wherein a numerical value obtained by dividing the sum total of minimum cross-sectional areas of the second heat transfer means which are disposed in the lower half of said casing by the sum total of minimum cross-sectional areas of the second heat transfer means which are disposed in the upper half of said casing is not less than 1.5.

21. The display device according to claim 19, wherein the second heat transfer means are rod members each having one end contacting at least one of said display panel and said electronic component and an opposite end contacting said heat-conductive sheet.

22. The display device according to claim 19, wherein the second heat transfer means are annular members each having a first portion contacting at least one of said display panel and said electronic component, a second portion contacting said heat-conductive sheet, and other portion than said first and second portions which is positioned to allow heat transfer to occur between said heat-conductive sheet and at least one of said display panel and said electronic component.

23. The display device according to claim 1, wherein said heat-conductive sheet comprises graphite.

24. The display device according to claim 1, wherein said display panel is a plasma display panel.

* * * * *